(12) United States Patent
Shirai et al.

(10) Patent No.: US 8,120,102 B2
(45) Date of Patent: *Feb. 21, 2012

(54) SEMICONDUCTOR DEVICE

(75) Inventors: Nobuyuki Shirai, Takasaki (JP); Nobuyoshi Matsuura, Takasaki (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/964,651

(22) Filed: Dec. 9, 2010

(65) Prior Publication Data

US 2011/0079842 A1    Apr. 7, 2011

Related U.S. Application Data

(60) Continuation of application No. 12/709,260, filed on Feb. 19, 2010, which is a continuation of application No. 11/944,343, filed on Nov. 21, 2007, now Pat. No. 7,768,065, which is a continuation of application No. 11/180,612, filed on Jul. 14, 2005, now Pat. No. 7,317,224, which is a division of application No. 10/915,416, filed on Aug. 11, 2004, now Pat. No. 6,930,354, which is a continuation of application No. 10/458,668, filed on Jun. 11, 2003, now abandoned.

(30) Foreign Application Priority Data

Jul. 19, 2002   (JP) .................. 2002-211019

(51) Int. Cl.
*H01L 29/76* (2006.01)
(52) U.S. Cl. ........ 257/330; 257/327; 257/331; 257/332; 257/341; 257/737; 257/738
(58) Field of Classification Search .................. 257/330, 257/327, 331, 332, 341, 737, 738
See application file for complete search history.

(56) References Cited

U.S. PATENT DOCUMENTS

| | | |
|---|---|---|
| 6,429,532 B1 | 8/2002 | Han et al. |
| 6,479,888 B1 | 11/2002 | Hirashima et al. |
| 6,653,740 B2 | 11/2003 | Kinzer et al. |
| 6,930,354 B2 | 8/2005 | Shirai et al. |
| 7,317,224 B2 | 1/2008 | Shirai et al. |

FOREIGN PATENT DOCUMENTS

| | | |
|---|---|---|
| JP | 7-249770 | 9/1995 |
| JP | 08-181307 | 7/1996 |
| JP | 08-340029 | 12/1996 |
| JP | 63-249346 | 10/1998 |
| JP | 2004-502293 A | 1/2004 |
| WO | WO 01/59842 A1 | 8/2001 |

*Primary Examiner* — Long Pham
(74) *Attorney, Agent, or Firm* — Miles & Stockbridge P.C.

(57) ABSTRACT

A semiconductor device includes a gate electrode GE electrically connected to a gate portion which is made of a polysilicon film provided in the inside of a plurality of grooves formed in a striped form along the direction of T of a chip region CA wherein the gate electrode GE is formed as a film at the same layer level as a source electrode SE electrically connected to a source region formed between adjacent stripe-shaped grooves and the gate electrode GE is constituted of a gate electrode portion G1 formed along a periphery of the chip region CA and a gate finger portion G2 arranged so that the chip region CA is divided into halves along the direction of X. The source electrode SE is constituted of an upper portion and a lower portion, both relative to the gate finger portion G2, and the gate electrode GE and the source electrode SE are connected to a lead frame via a bump electrode.

12 Claims, 33 Drawing Sheets

RELATION BETWEEN GATE RESISTANCE AND EFFICIENCY

7

7

SEMICONDUCTOR DEVICE

CROSS-REFERENCE TO RELATED APPLICATION

This application is a continuation of application Ser. No. 12/709,260 filed Feb. 19, 2010, which is a continuation of application Ser. No. 11/944,343 filed Nov. 21, 2007 (now U.S. Pat. No. 7,768,065), which is a continuation of application Ser. No. 11/180,612 filed Jul. 14, 2005 (now U.S. Pat. No. 7,317,224), which is a division of application Ser. No. 10/915,416 filed Aug. 11, 2004 (now U.S. Pat. No. 6,930,354), which is a continuation of application Ser. No. 10/458,668 filed Jun. 11, 2003 (now abandoned).

BACKGROUND OF THE INVENTION

This invention relates to a technique for semiconductor devices and more particularly, to a technique effective for application to semiconductor devices having power MISFET (metal insulator semiconductor field effect transistor).

Transistors for high-power purposes dealing with electric power of several watts (W) or over are called power transistor, and various types of structures have been studied.

Among them, power MISFET includes ones called a longitudinal type and a transverse type and are classified into a trench-type structure and a planar structure depending on the structure of a gate portion.

Such power MISFET has a multitude of (e.g. several tens of thousands of) MISFET's in fine pattern connected in parallel in order to obtain high power.

For instance, Japanese Unexamined Patent Publication No. Hei 7 (1995)-249770 discloses power MISFET of the trench gate type.

SUMMARY OF THE INVENTION

We have engaged in studies and developments of power MISFET used as a high-efficiency power supply and the like.

With such power MISFET as mentioned above, it is required to reduce an ON resistance (Ron), a gate capacitance (Qg) and, particularly, a gate-drain capacitance (Qgd). A great current can be obtained by reducing the ON resistance. The reduction of the capacitance between the gate and drain leads to an improved switching switching characteristic.

Under these circumstances, studies have been made on the scale down of power MISFET and, particularly, on the reduction in width of a groove where a gate portion is formed.

More particularly, in order to reduce the ON resistance, it is necessary to increase a channel area per unit area. If the width of the groove at which a gate portion is to be formed is made small, a channel area per unit area can be increased. If the width of the groove at which a gate portion is to be formed is made small, then a counter area for a drain portion at the side of a substrate opposite to the gate portion can be made small, thereby ensuring reduction of the capacitance (Qgd).

However, when the width of the groove where the gate portion is to be formed, the resistance of the gate portion becomes large, thereby causing the switching characteristic to be degraded instead.

Especially, in high frequency operations, an efficiency η is greatly influenced depending on the resistance of the gate portion as will be hereinafter described in detail. This efficiency means a value of output power/input power.

Accordingly, a measure for reducing the resistance of the gate portion becomes important.

An object of the invention is to provide a semiconductor device of the type wherein the resistance of a gate portion of power MISFET is reduced.

Another object of the invention is to provide a semiconductor device of the type wherein a semiconductor device having power MISFET can be improved in characteristics.

The above and other objects and novel features of the invention will become apparent from the following description with reference to the accompanying drawings.

Typical embodiments of the invention among those embodiments set forth in this application are briefly described below.

A semiconductor device according to the invention comprises:

(a) a MISFET formed in a chip region of a semiconductor substrate and having a gate portion, a source portion and a drain portion, each made of a first conductor;

(b) a gate electrode which is electrically connected with the gate portion and is made of a second conductor having a resistivity lower than the first conductor and which includes (b1) a first portion formed along a periphery of the chip region and (b2) a second portion connected with the first portion and formed on the inside of said first portion in said chip region;

(c) a source electrode which is electrically connected with the source portion and is made of the second conductor and which is formed plurally within the chip region;

(d) a bump electrode formed on the upper portions of the gate electrode and the plurality of source electrodes, respectively;

(e) the gate electrode and the plurality of source electrodes being arranged at the same layer level; and (f) the second portion of the gate electrode being arranged between adjacent source electrodes of the plurality of source electrodes.

EMBODIMENTS OF THE INVENTION

Figure 1:
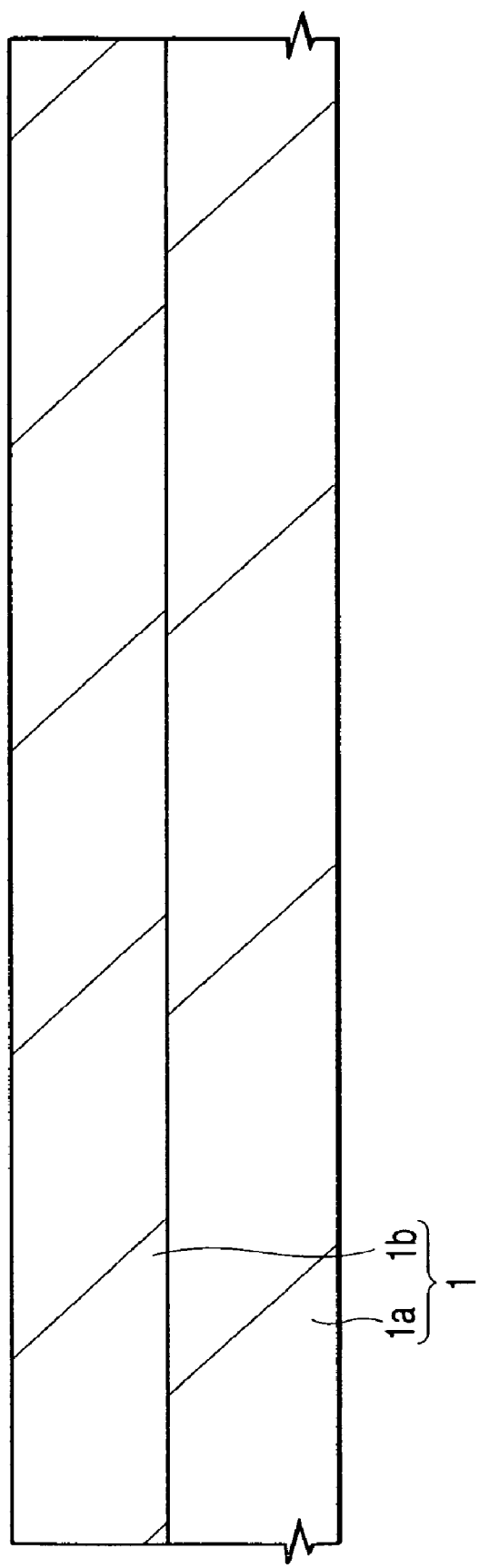
FIG. 1 is a sectional view of an essential part of a substrate showing a fabrication method of a semiconductor device according to Embodiment 1 of the invention.

The embodiments of the invention are described with reference to the accompanying drawings, in which like members or parts having a similar function are indicated by like reference numerals throughout the drawings illustrating the embodiments and are not repeatedly explained.

Embodiment 1

A semiconductor device according to this embodiment is described by way of a fabrication method thereof.

FIGS. 1 to 16 are, respectively, a sectional or plan view of an essential part of a substrate showing a fabrication method of a semiconductor device according to the embodiment. The sectional view corresponds, for example, to a section taken along line A-A of a plan view.

Initially, as shown in FIG. 1, a semiconductor substrate 1 (hereinafter referred to simply as "substrate"), in which a single crystal silicon layer 1b doped with an n-type impurity (e.g. arsenic) is epitaxially grown on the surface 1a of an n-type single crystal, is provided.

Figure 2:
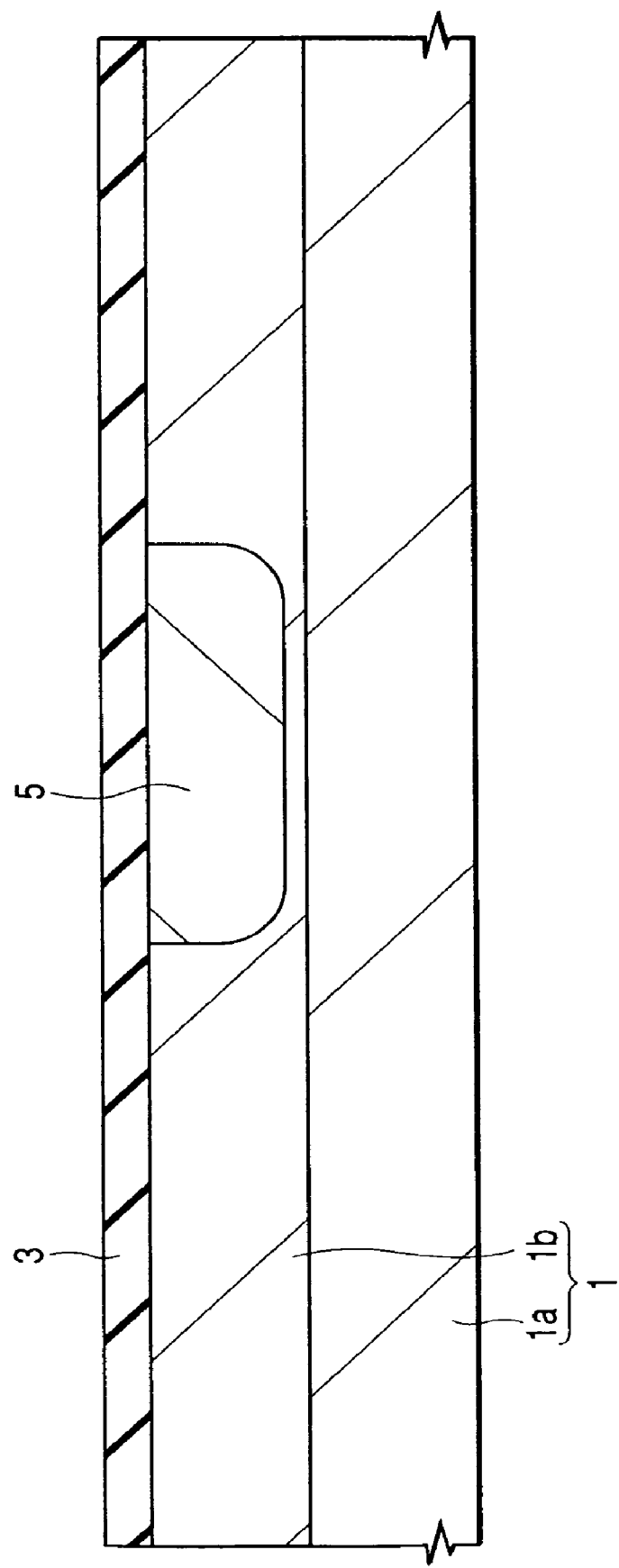
FIG. 2 is a sectional view of the essential part of the substrate showing the fabrication method of a semiconductor device according to Embodiment 1 of the invention.

Next, as shown in FIG. 2, the surface of the substrate 1 is, for example, thermally oxidized to form a silicon oxide film 3. Thereafter, a p-type impurity (e.g. boron) is injected over the silicon oxide film 3 through a mask of a silicon nitride film (not shown) which has been patterned by use of a lithographic technique, followed by thermal diffusion to form a p-type well 5. Next, the silicon nitride film is removed.

Figure 3:
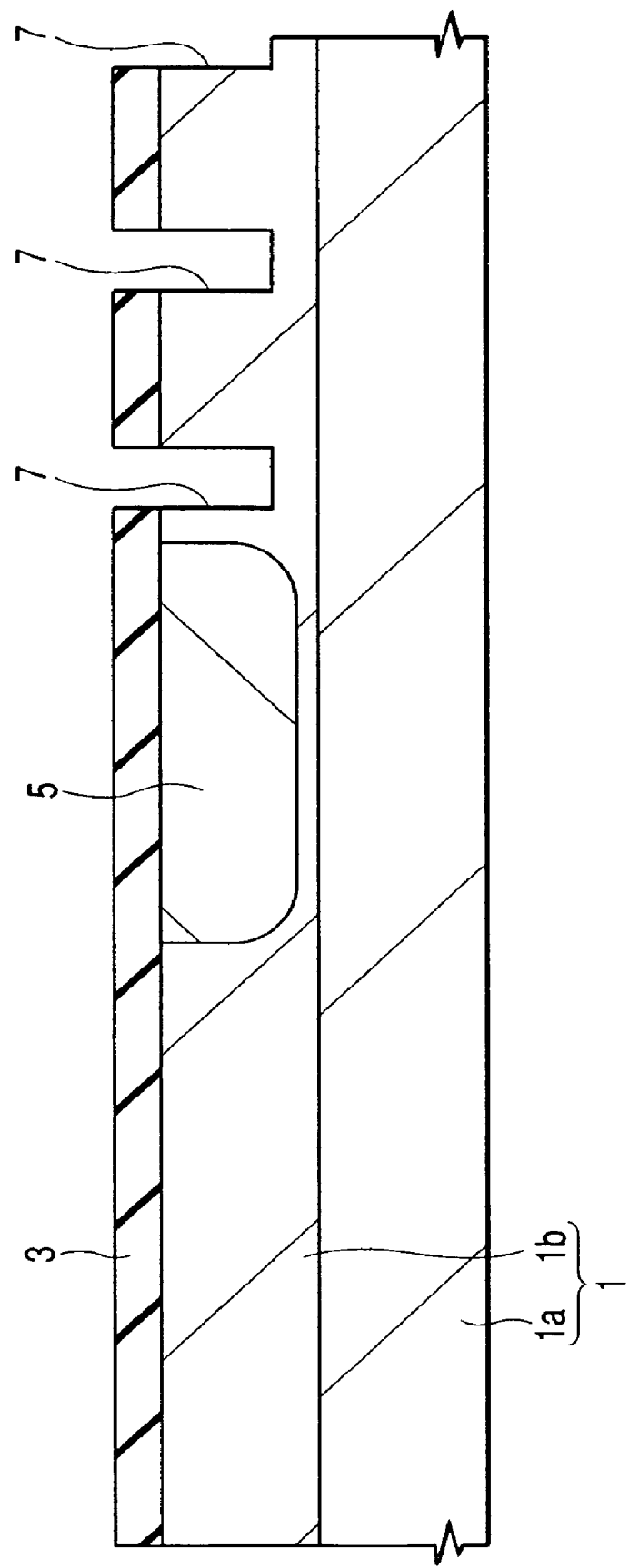
FIG. 3 is a sectional view of the essential part of the substrate showing the fabrication method of a semiconductor device according to Embodiment 1 of the invention.
Figure 4:
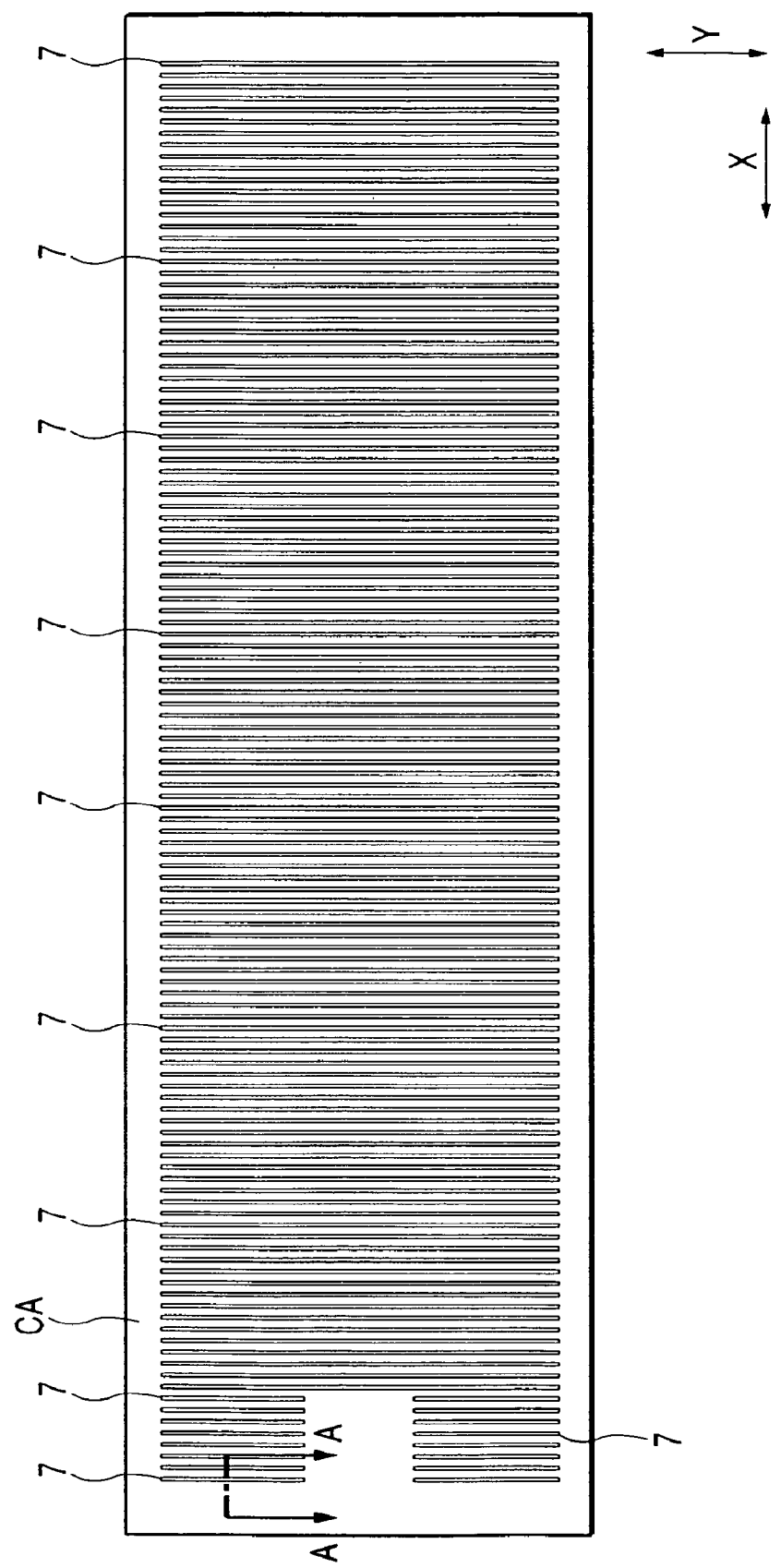
FIG. 4 is a sectional view of the essential part of the substrate showing the fabrication method of a semiconductor device according to Embodiment 1 of the invention.

Subsequently, as shown in FIGS. 3 and 4, the silicon oxide film 3 and the substrate 1 are, respectively, etched through a mask of a film patterned by the use of a photolithographic technique to form grooves (trenches) 7. As shown in FIG. 4, the pattern of each groove 7 is in the form of a stripe extending along the direction of Y. CA indicates a chip region. This chip region is in the form of a rectangle (oblong) elongated along the direction of X. It will be noted that although not shown in the figure, a great number of chips of the type as mentioned above are provided on the wafer-shaped semiconductor substrate 1.

Figure 5:
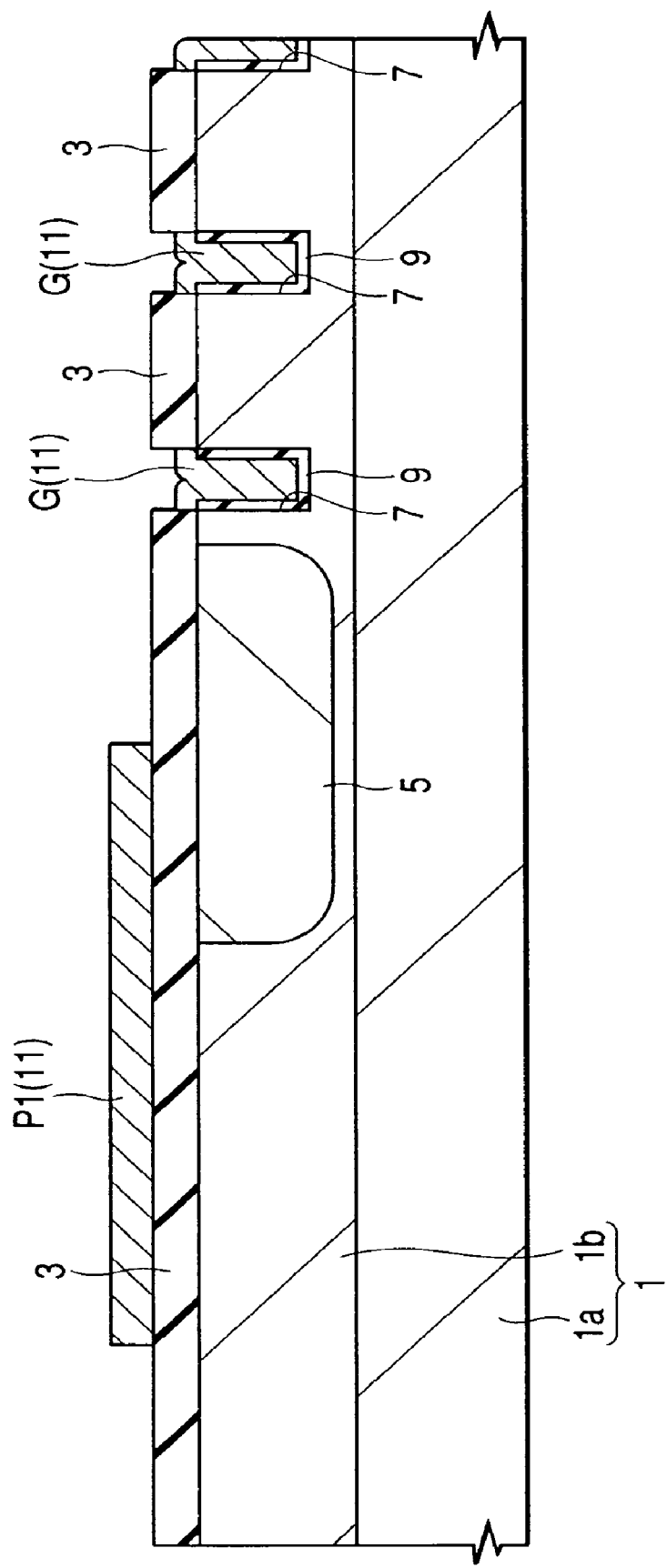
FIG. 5 is a sectional view of the essential part of the substrate showing the fabrication method of a semiconductor device according to Embodiment 1 of the invention.
Figure 6:
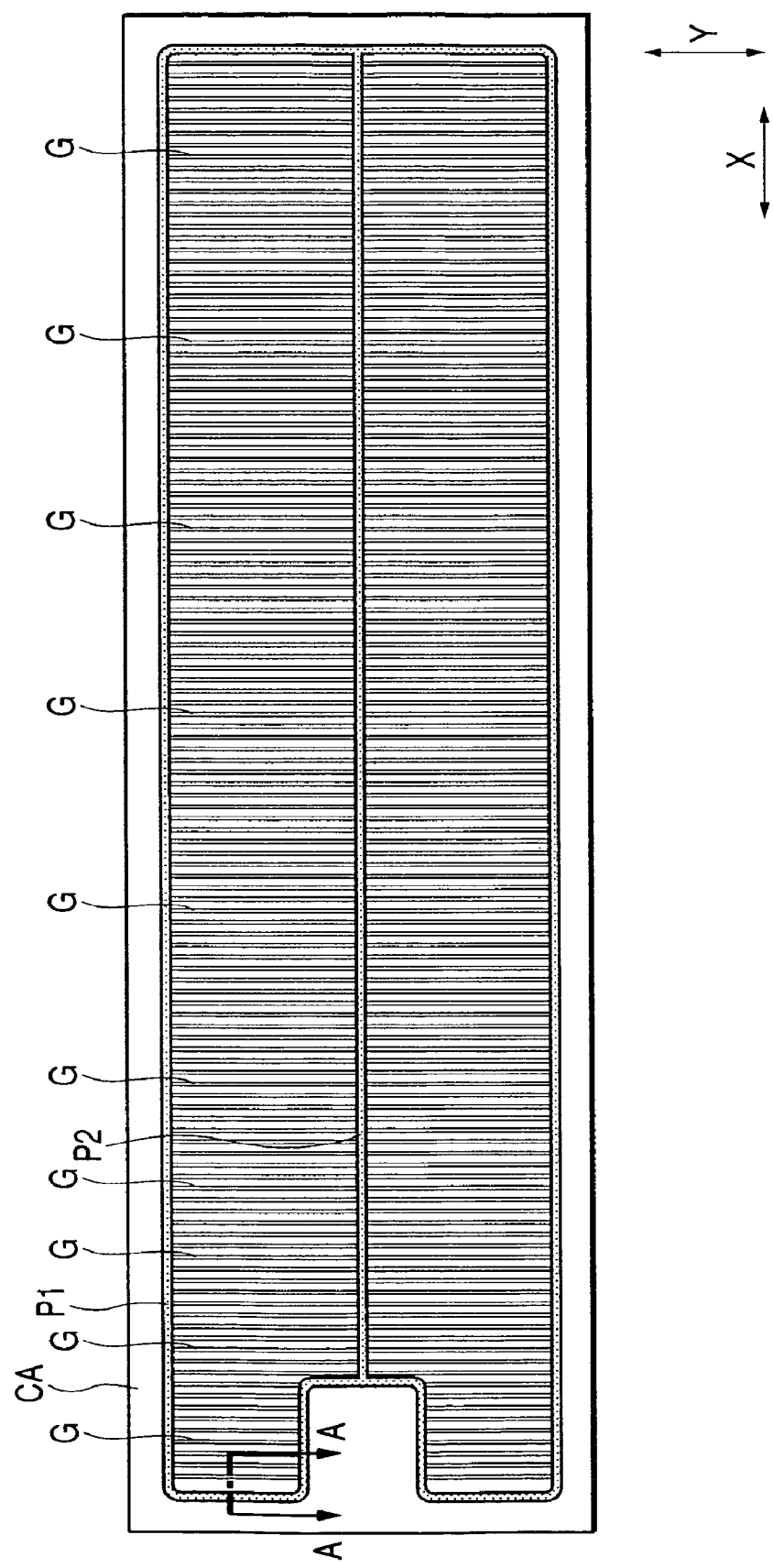
FIG. 6 is a sectional view of the essential part of the substrate showing the fabrication method of a semiconductor device according to Embodiment 1 of the invention.

Next, as shown in FIGS. 5 and 6, the substrate 1 is thermally treated to form a thermally-oxidized film 9 on the bottom and side walls of each groove 7. This thermally oxidized film 9 serves as a gate insulating film of power MISFET. Next, an impurity-doped, low resistance polysilicon film 11 is deposited to such an extent that each groove 7 is buried. During the deposition, the polysilicon film 11 is formed as a layer on the silicon oxide film 3 over the p-type well 5.

Thereafter, the polysilicon film 11 is etched through a mask of a photoresist film (hereinafter referred to simply as "resist film") not shown, the polysilicon film 11 is left inside the groove 7. The inside polysilicon 11 acts as a gate portion G of power MISFET. Subsequently, a polysilicon film pattern P1 is formed over an outer periphery of a chip region CA, and a polysilicon film pattern P2 which is arranged to divide the chip region CA into halves along the direction of X is also formed (FIG. 6). The patterns P1 and P2 are connected to each other. The region where the silicon oxide film 3 is formed below the polysilicon film pattern P1 serves as an element isolation region, and regions which are marked off with this region are provided as an element forming region (active).

Figure 7:
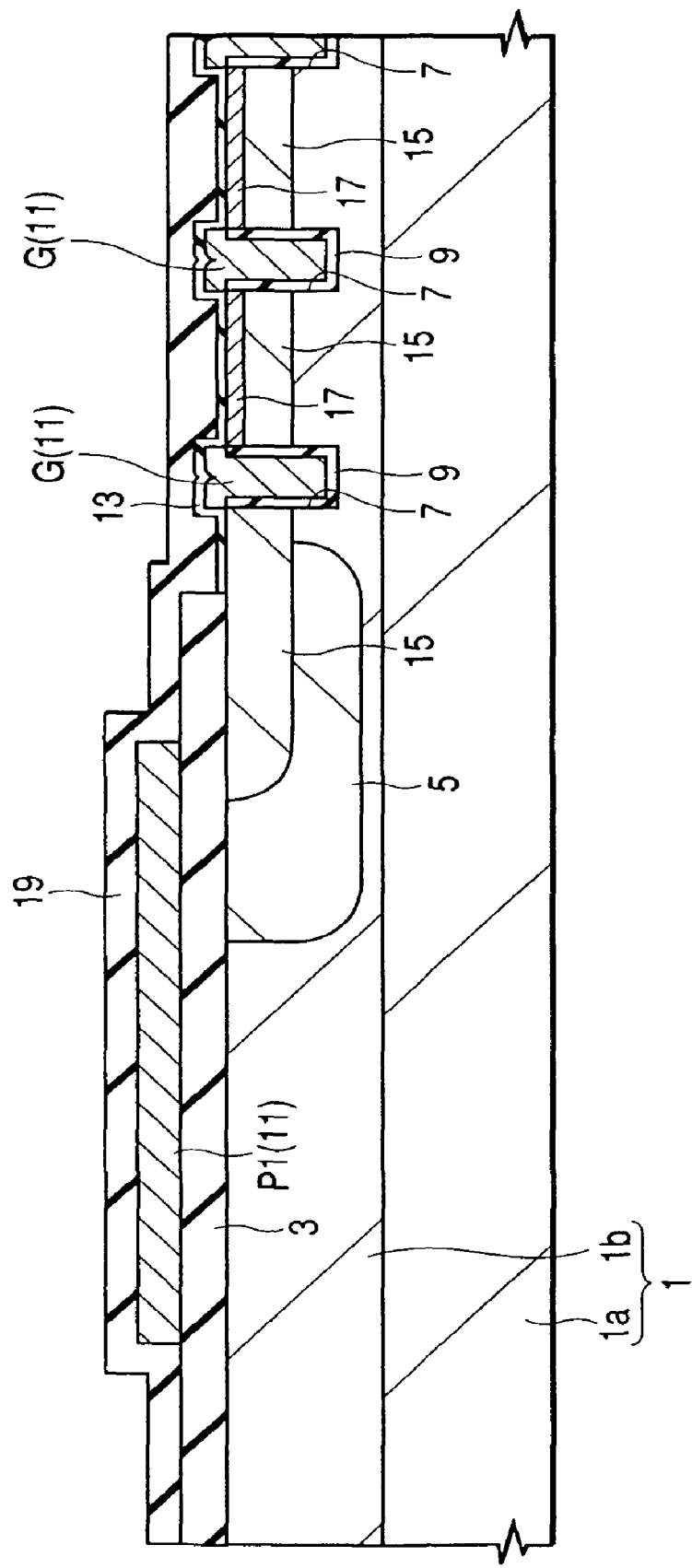
FIG. 7 is a sectional view of the essential part of the substrate showing the fabrication method of a semiconductor device according to Embodiment 1 of the invention.

Next, the silicon oxide film 3 in the element forming region is removed and a thin silicon oxide film 13 is formed over the gate portion G and also over each portion between the grooves 7 as is particularly shown in FIG. 7. Thereafter, a p-type impurity is injected into the substrate 1 at the portion thereof between the grooves 7 and is diffused, thereby forming a p-type semiconductive region (channel region) 15. This p⁻-type semiconductive region 15 extends to the inside of the p-type well 5.

Figure 8:
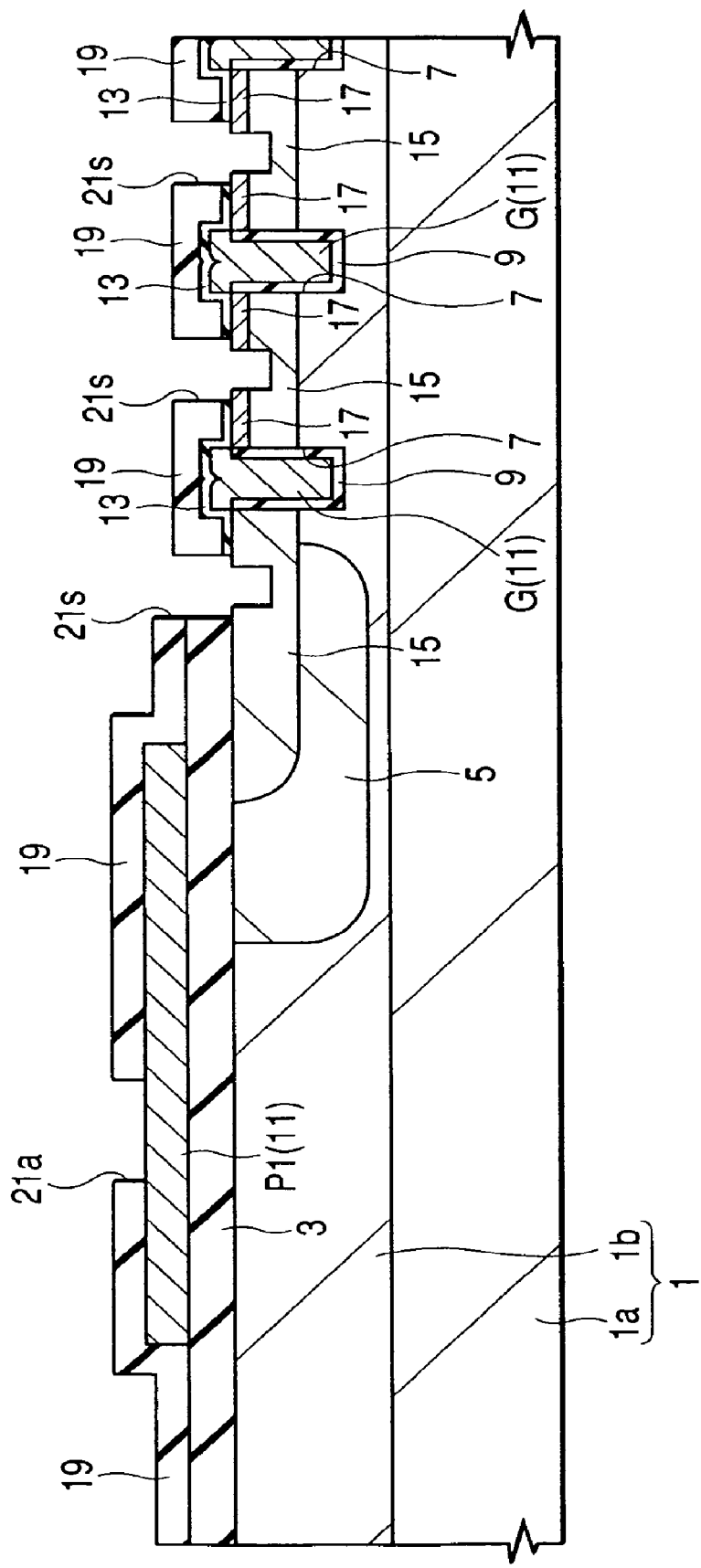
FIG. 8 is a sectional view of the essential part of the substrate showing the fabrication method of a semiconductor device according to Embodiment 1 of the invention.

Next, an n-type impurity (e.g. arsenic) is injected into the substrate 1 at a portion between the grooves 7 through a mask of a resist film (not shown) and diffused to form an n⁺-type semiconductive region (source region) 17. It will be noted that this n'-type semiconductive region (source region) 17 extends between the gate portions G, shown in FIG. 6, in the form of a stripe. Next, as shown in FIGS. 8 and 9, a silicon oxide film 19 is formed over the substrate 1, after which the silicon oxide films 13, 19 at a portion between the gate portions G and the substrate 1 (i.e. the p⁻-type semiconductive region 15 and the n⁺-type semiconductive region 17) are, respectively, etched to form a contact groove (source contact) 21s.

This contact grove 21s is so arranged as to permit the n⁺-type semiconductive region 17 to be exposed from the side walls thereof and the p⁻-type semiconductive region 15 to be exposed from the bottom thereof. In other words, the depth of the contact groove 21s exceeds the n⁺-type semiconductive region 17 and arrives at the p⁻-type semiconductive region 15.

Figure 9:
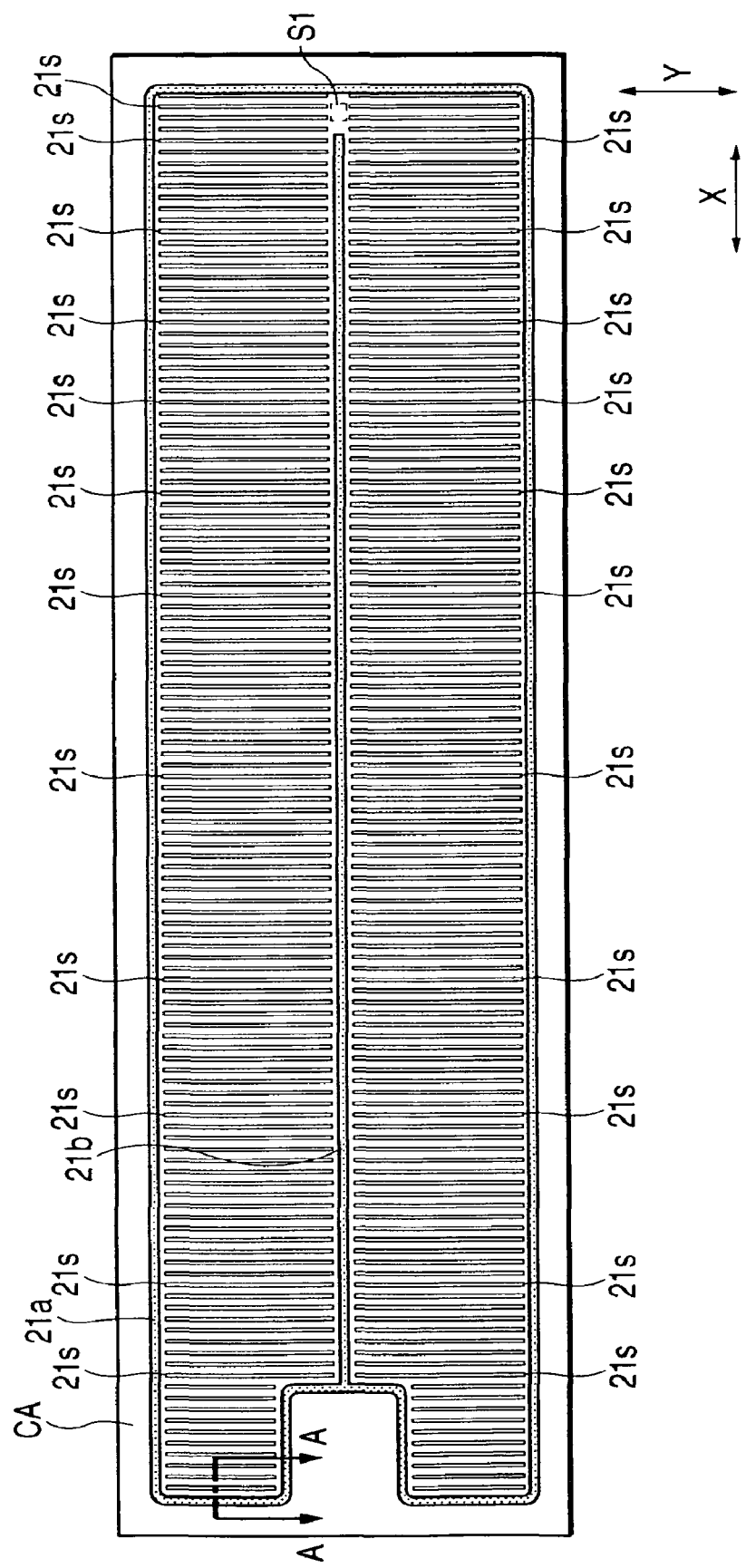
FIG. 9 is a plan view of the essential part of the substrate showing the fabrication method of a semiconductor device according to Embodiment 1 of the invention.

At this stage, the silicon oxide film 19 on the polysilicon film patterns P1 and P2 is removed to form contact grooves (gate contacts 21a, 21b) (see FIG. 9). The contact groove on the pattern P1 is indicated at 21a and the contact groove on the pattern P2 is indicated at 21b.

The contact groove 21b is contacted at one end thereof (i.e. at a left end as viewed in FIG. 9) with the contact groove 21a, and the other end (i.e. a right end as viewed in FIG. 9) is not contacted with the contact groove 21a. More particularly, a space S1 is established between the contact grooves 21a and 21b.

Figure 10:
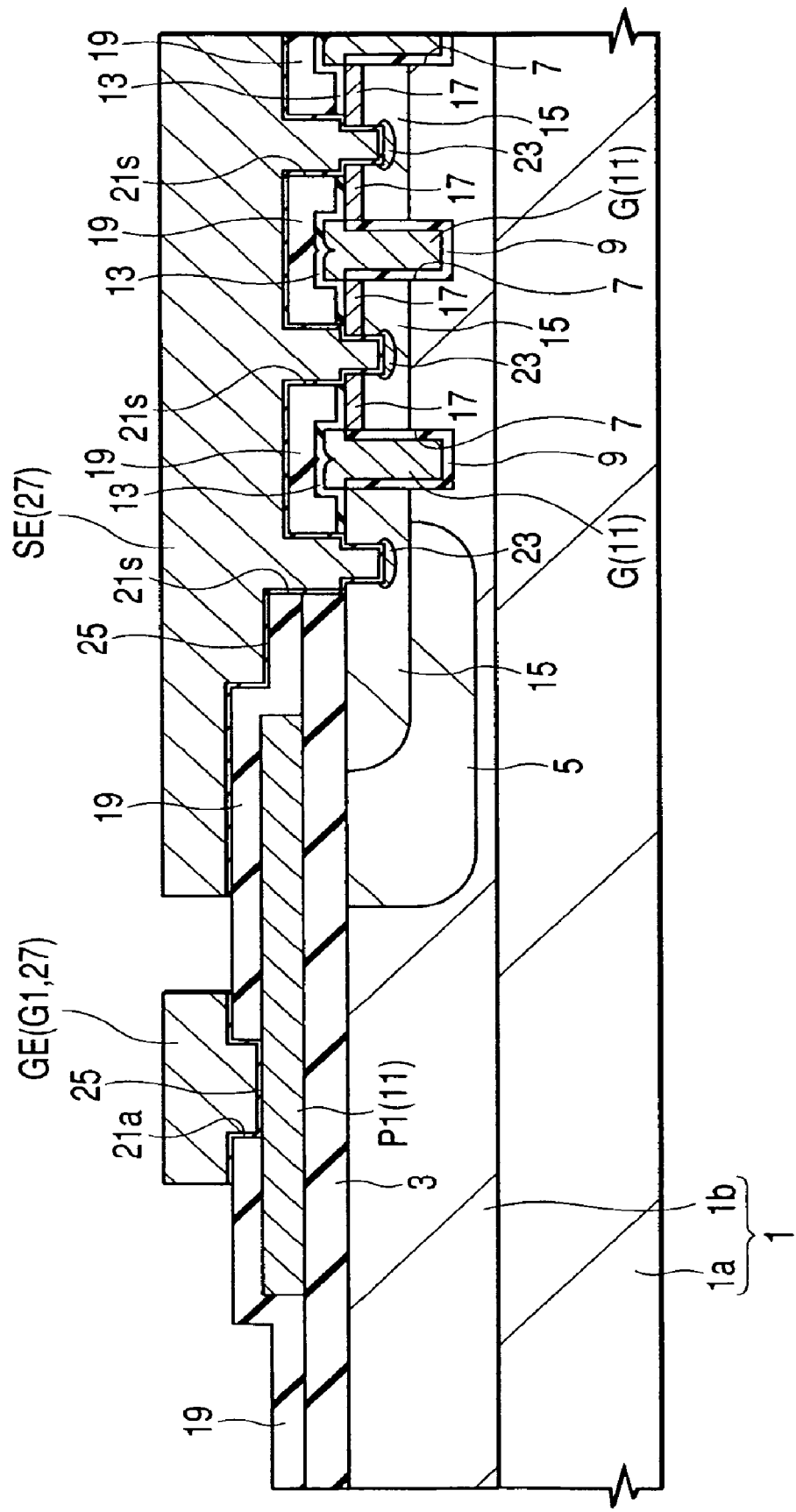
FIG. 10 a sectional view of the essential part of the substrate showing the fabrication method of a semiconductor device according to Embodiment 1 of the invention.
Figure 11:
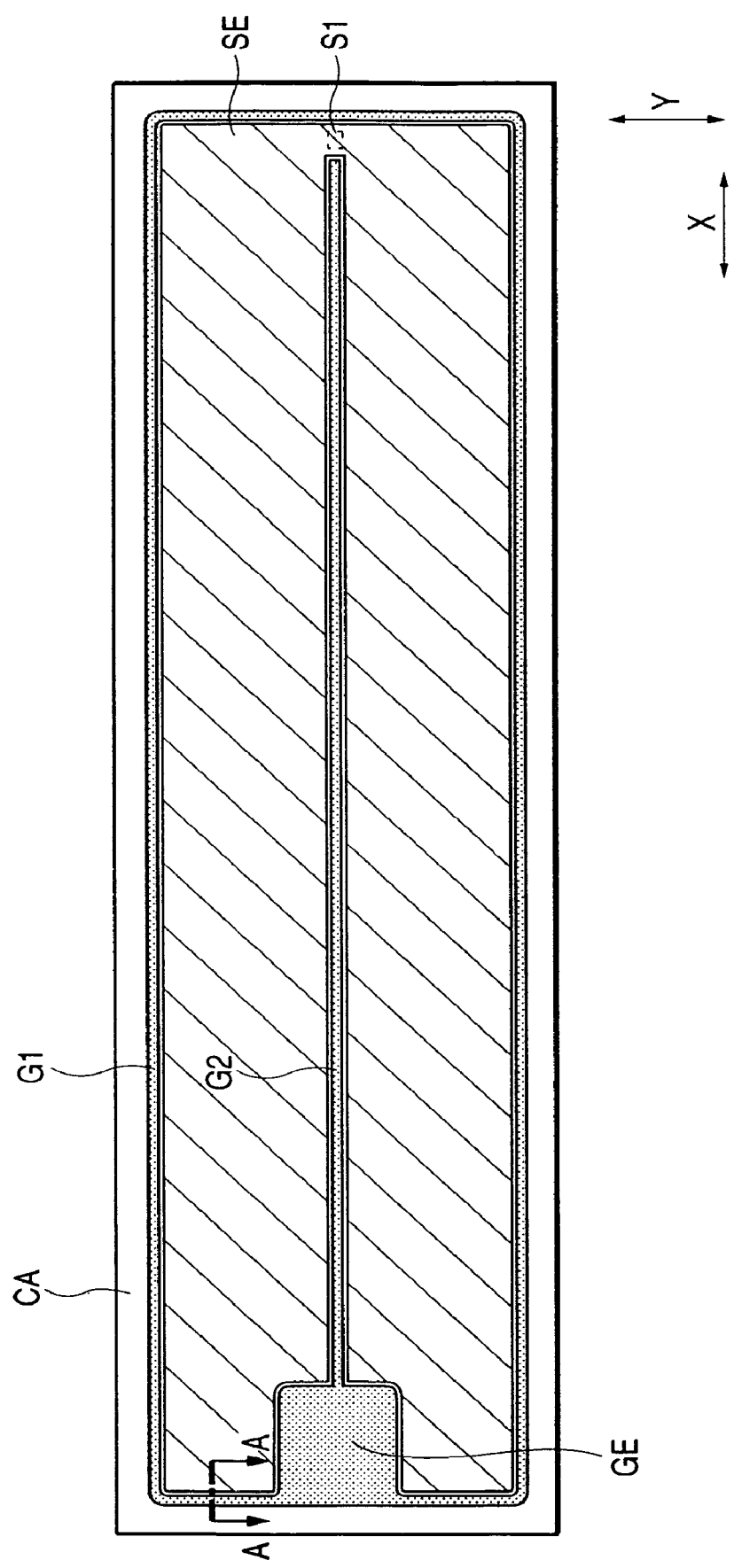
FIG. 11 is a plan view of the essential part of the substrate showing the fabrication method of a semiconductor device according to Embodiment 1 of the invention.

Next, as shown in FIGS. 10 and 11, a p-type impurity such as, for example, boron fluoride (BF₂), is injected into the bottom of the contact groove 21s and diffused to form a p⁺-type semiconductive region (back gate contact region) 23. More particularly, the source electrode formed on the contact groove 21s is connected to the source region 17 and further to the back gate via the p⁺-type semiconductive region 23.

Figure 35:
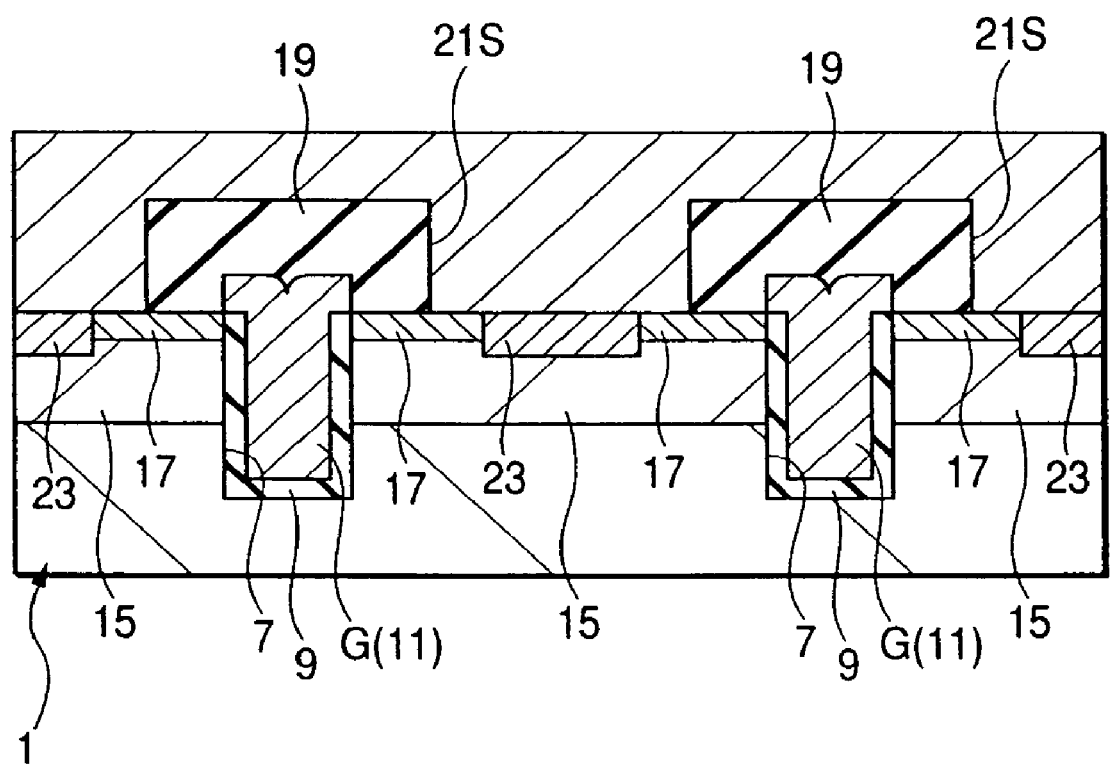
FIG. 35 is a sectional view of the essential part of the substrate for illustrating the effect of Embodiment 1 of the invention.

In this way, the contact groove 21s is formed and the p⁺-type semiconductive region 23 is formed at the bottom thereof, so that an allowance for mask alignment can be reduced and spaces between the gate portions can be made finer over the case where a device having such a structure as shown in FIG. 35 is formed.

Next, according to a sputtering method, a TiW (titanium tungsten) film 25 is thinly deposited, for example, as a barrier film over the silicon oxide film 19 including the insides of the contact holes (21s, 21a, 21b), followed by thermal treatment. Subsequently, an aluminium (Al) film 27 is deposited, for example, as a conductive film according to a puttering method. This barrier film serves to prevent an undesirable reaction layer from being formed owing to the contact between Al and the substrate (Si). It will be noted that the Al film means a film mainly made of Al, and other types of metals may be contained therein.

Next, the TiW film 25 and the Al film 27 are, respectively, etched through a mask of a resist film not shown to form a gate electrode (gate leading electrode) GE and a source electrode (source leading electrode) SE. These electrodes (GE, DE) serve as a first-layer wiring.

As shown in FIG. 11, the gate electrode GE includes a gate electrode portion (first portion) G1 formed along the periphery of the chip region CA and a gate finger portion (second portion) G2 which is so arranged as to divide the chip region CA into halves along the direction of X. The pattern of the gate electrode GE is shown in FIG. 12, and the pattern of the source electrode SE is shown in FIG. 13.

Figure 12:
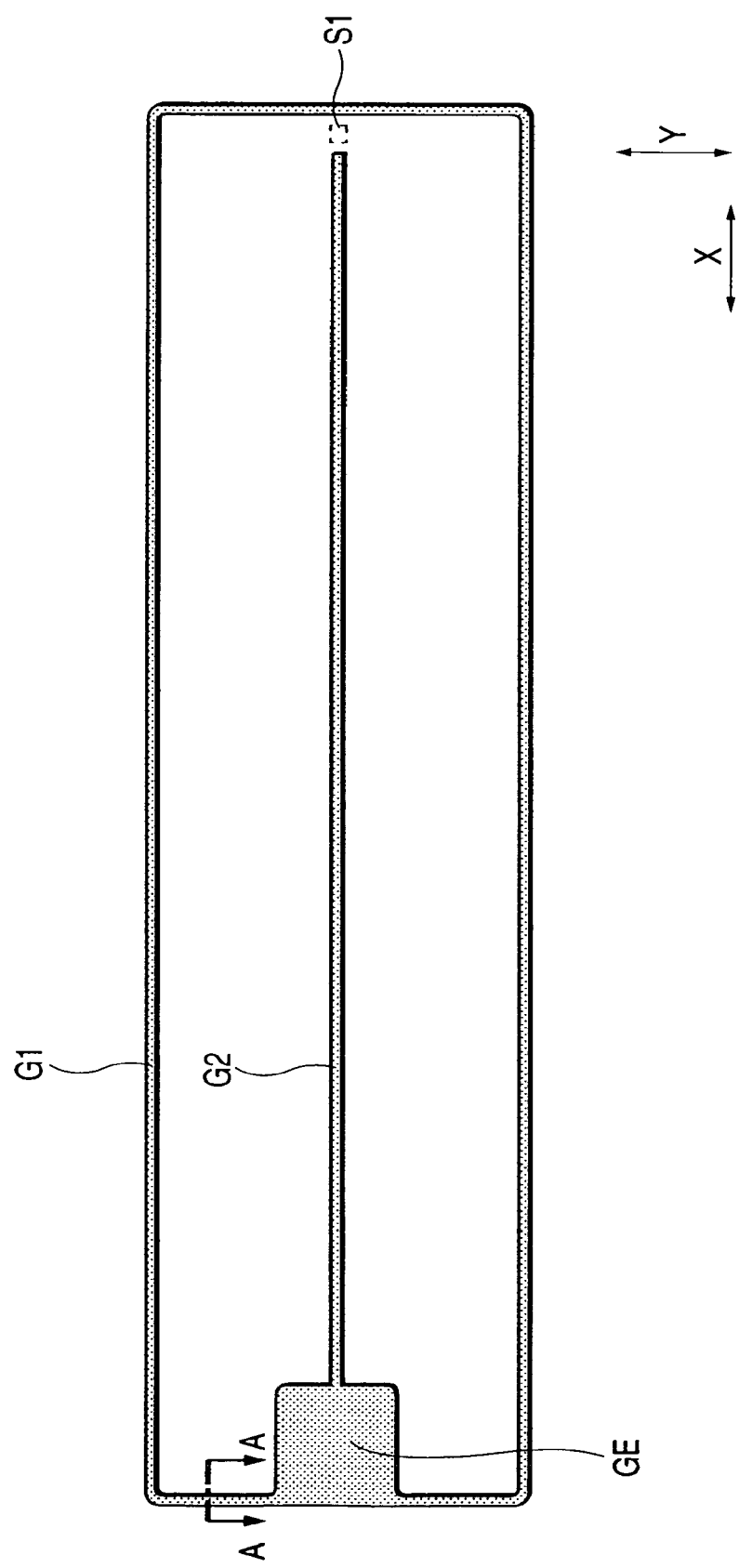
FIG. 12 is a plan view of the essential part of the substrate showing the fabrication method of a semiconductor device according to Embodiment 1 of the invention.

As shown in FIGS. 11 and 12, the gate electrode portion G1 is positioned on the polysilicon film pattern P1 and also on the contact groove 21a. The gate finger portion G2 is positioned on the polysilicon film pattern P2 and also on the contact groove 21b.

It should be noted that any gate finger portion G2 is not formed on the space between the contact grooves 21a and 21b (space S1).

Figure 13:
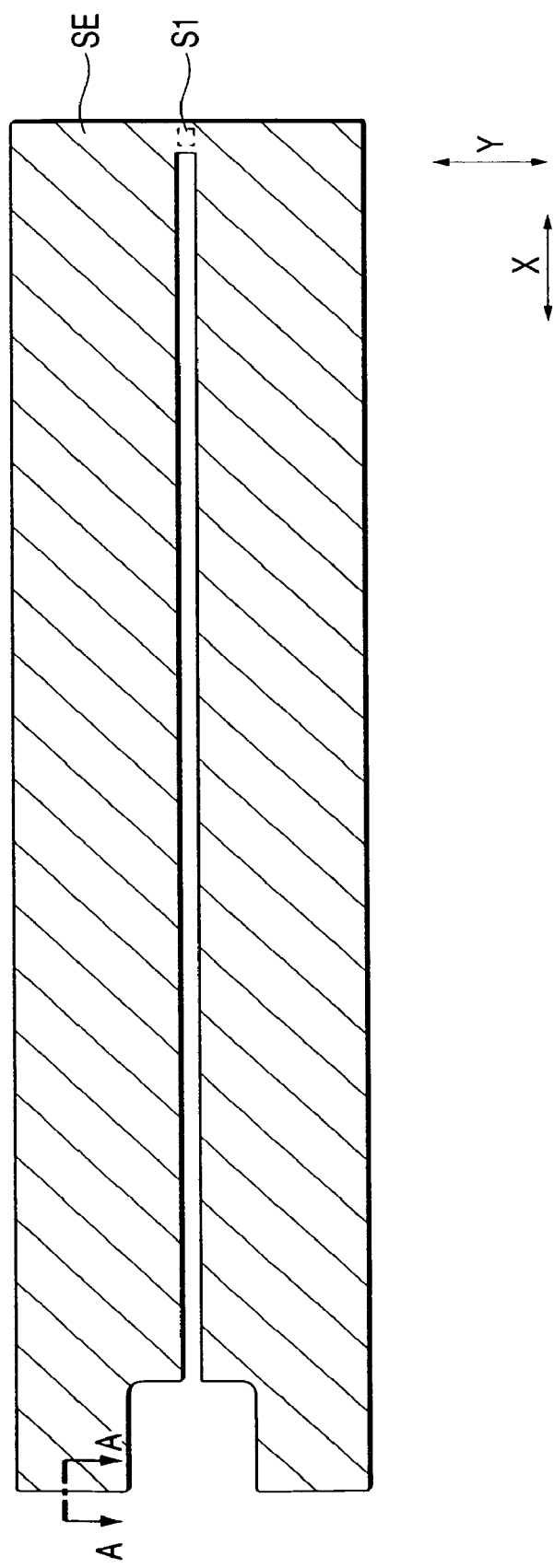
FIG. 13 is a plan view of the essential part of the substrate showing the fabrication method of a semiconductor device according to Embodiment 1 of the invention.

On the other hand, the source electrode SE is constituted, as shown in FIGS. 11 and 13, of a portion which is located at one of the halves of the chip region CA divided with the polysilicon film pattern P2 (i.e. an upper side portion relative to the gate finger portion G2) and a portion located at the other half of the chip region (i.e. a lower side portion relative to the gate finger portion G2). These portions are connected to each other and combined together at the space S1. In other words, the halves of the source electrode SE are connected in the vicinity of at the end portion of the gate finger portion G2.

It will be noted that the gate electrode GE and the source electrode SE are at the same layer level, and a guard ring (not shown) may be formed at the outside of the gate electrode GE for protection of the element.

Figure 14:
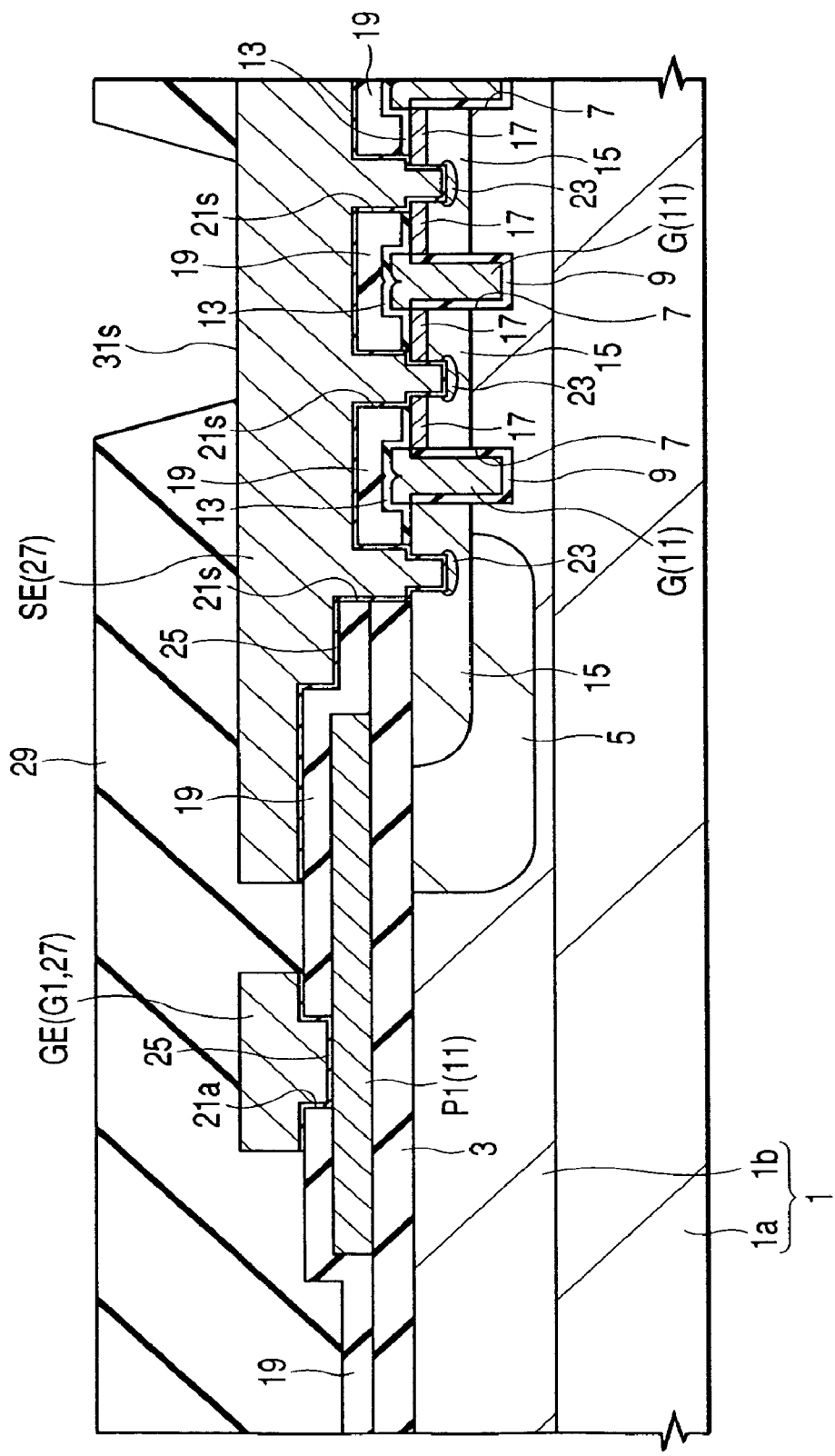
FIG. 14 is a sectional view of the essential part of the substrate showing the fabrication method of a semiconductor device according to Embodiment 1 of the invention.
Figure 15:
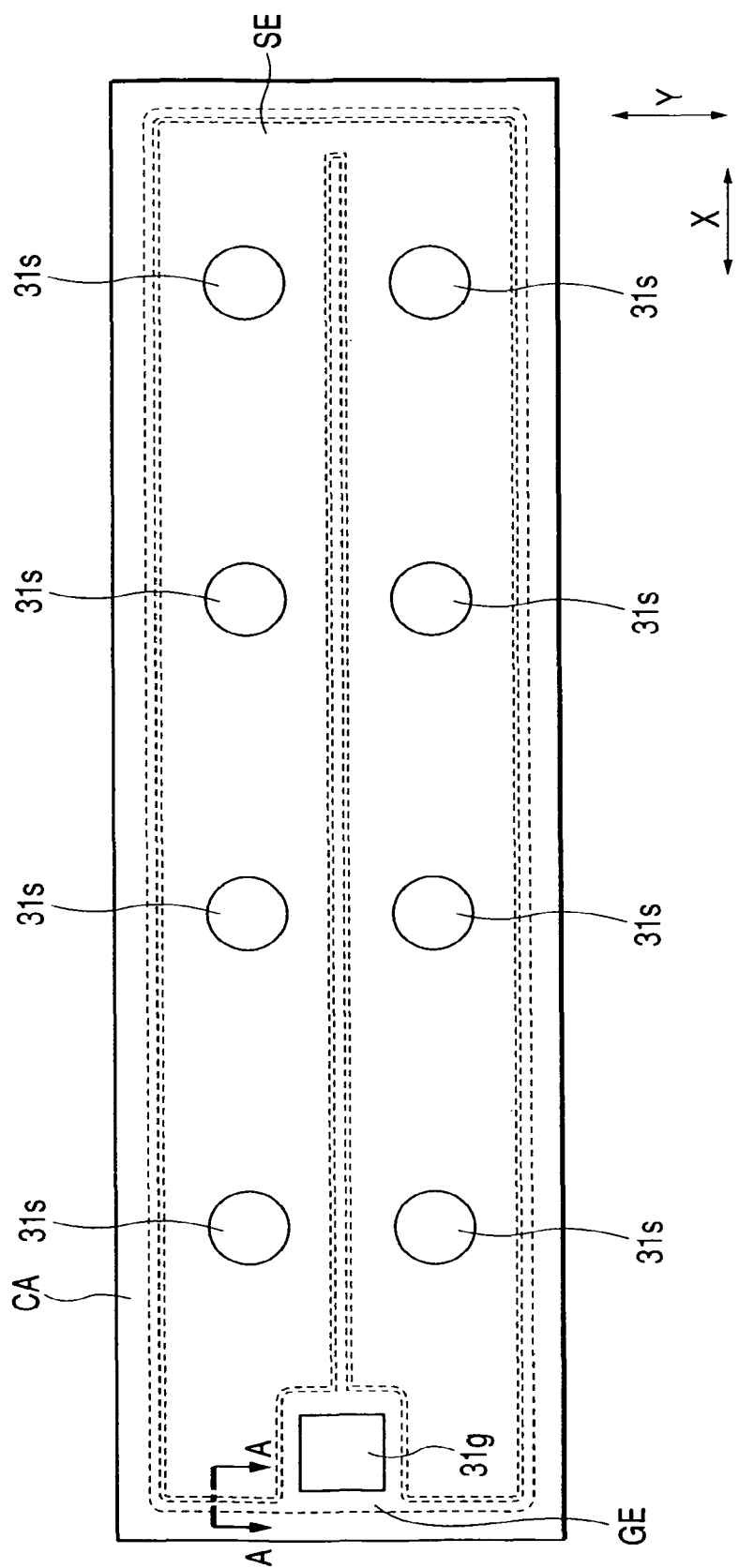
FIG. 15 is a plan view of the essential part of the substrate showing the fabrication method of a semiconductor device according to Embodiment 1 of the invention.

Next, as shown in FIGS. 14 and 15, a polyimide resin film 29 is applied to over the substrate 1, for example, as a protective film, followed by exposure to light and development thereby removing the polyimide resin film 29 formed on the gate electrode GE and the source electrode SE to form openings (pad portions) 31g, 31s. The Al film 27 (the gate electrode GE and the source electrode SE) is exposed at these openings. It is to be noted that although the opening 31s does not appear at the section taken along the line A-A of FIG. 15, the opening 31s is illustrated in FIG. 14 in order to clarify the relation between the source electrode SE and the opening 31s.

Figure 16:
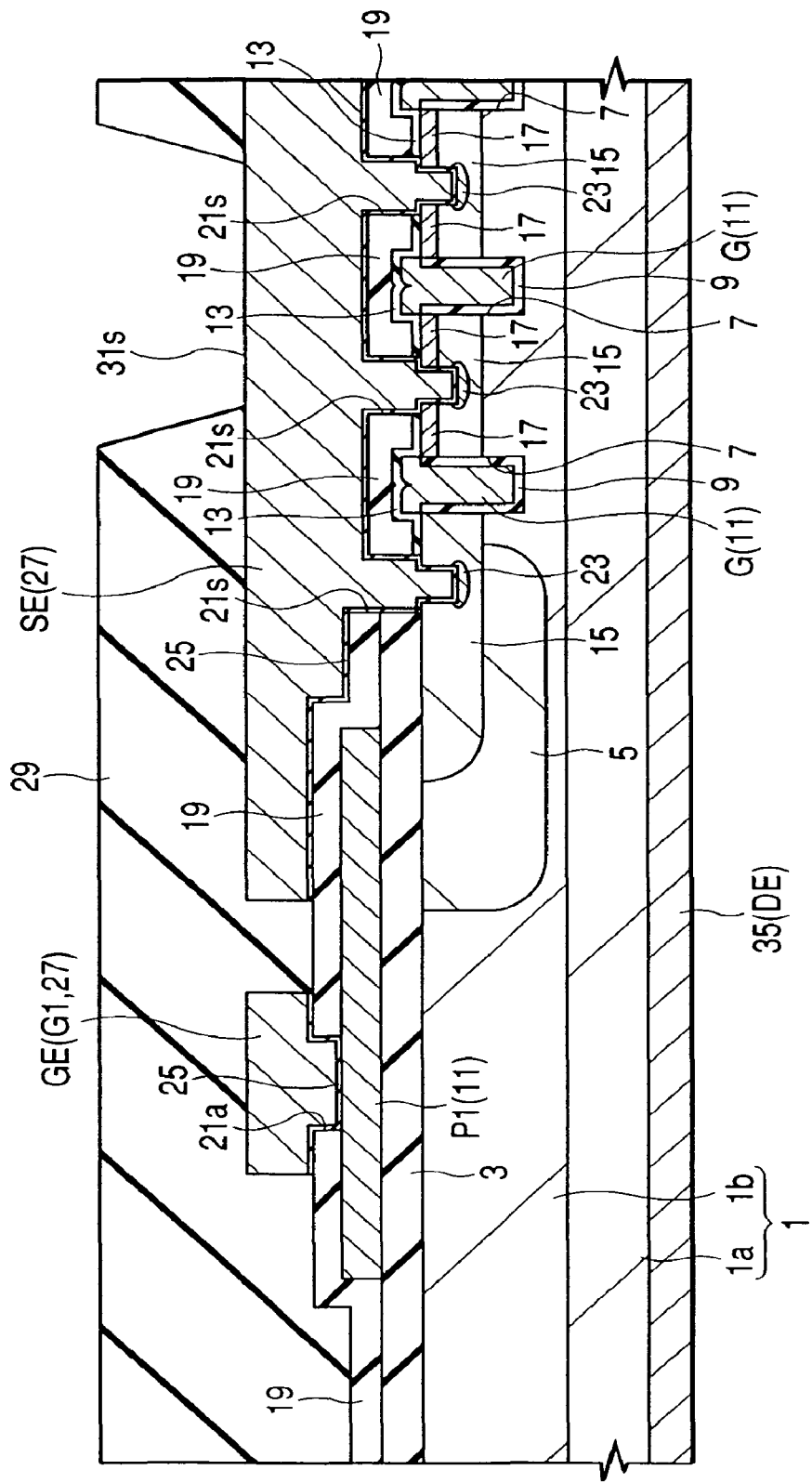
FIG. 16 is a sectional view of the essential part of the substrate showing the fabrication method of a semiconductor device according to Embodiment 1 of the invention.

Thereafter, the substrate 1 is protected such as with a tape on the surface thereof, after which the substrate 1 is polished at the back side thereof so that the protecting face is turned downside as shown in FIG. 16. Subsequently, a Ni (nickel) film, a Ti (titanium) film and a Au (gold) film are successively formed, for example, as a conductive film, on the back side of the substrate 1 according to a sputtering method, thereby forming a built-up film 35 thereof. This built-up film 35 serves as a leading electrode (drain electrode DE) for drains (1a, 1b).

Next, the tape is peeled off and a bump electrode made, for example, of gold or the like is formed at the openings 31g, 31s, respectively, followed by dicing the wafer-shaped substrate 1 along the chip region, packaging the resulting individual chips on a lead frame (packaging plate) and sealing (packaging) with a resin or the like. Eventually, a semiconductor device is completed. With respect to bump-forming and packaging procedures, these are described in detail in Embodiment 4 or the like and are not illustrated herein.

Thus, according to this embodiment, the gate finger portion G2 is disposed in the gate electrode GE, so that the gate resistance Rg can be reduced. As a result, switching characteristics can be improved.

Especially, because the gate-drain capacitance (Qgd) is reduced, the gate resistance can be reduced if the width of a groove where the gate portion is formed is made small (particularly, in the case where the groove is formed as a stripe). Thus, it becomes possible to reduce the gate-drain capacitance (Qgd), ensure high-speed switching operation due to the reduction of the gate resistance and reduce a switching loss.

Figure 37:
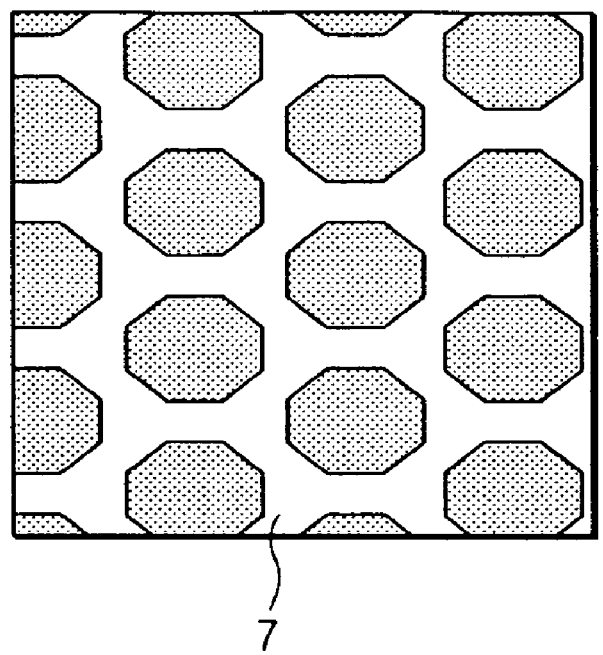
FIG. 37 is a plan view showing an essential part of a substrate showing a further groove pattern according to an embodiment of the invention.

Especially, where the groove pattern is formed as a stripe, it is possible to reduce the gate resistance according to this embodiment with the tendency that the gate resistance Rg increases in proportion to the pattern length of the groove over the case using a pattern of FIG. 37 described hereinafter because the cells arranged in parallel become small in number.

Upon driving LSI, there is a tendency toward low voltage and great electric current. For instance, with CPU of a notebook computer, studies have been made to design a drive voltage at about 1.6V and an applied current at about 20 A. In addition, miniaturization of a notebook computer and the like has been greatly required, for which a working frequency (f) is in a high frequency range of from 300 kHz to 500 kHz. Studies on the breakdown of a loss of a synchronous rectifying circuit used as a power supply for notebook computers and constituted of power MISFET reveal that the sum of "on" loss and switching loss is at 50% or over. Accordingly, it will be seen that the reduction of these losses contributes greatly to high efficiency.

Figure 17:
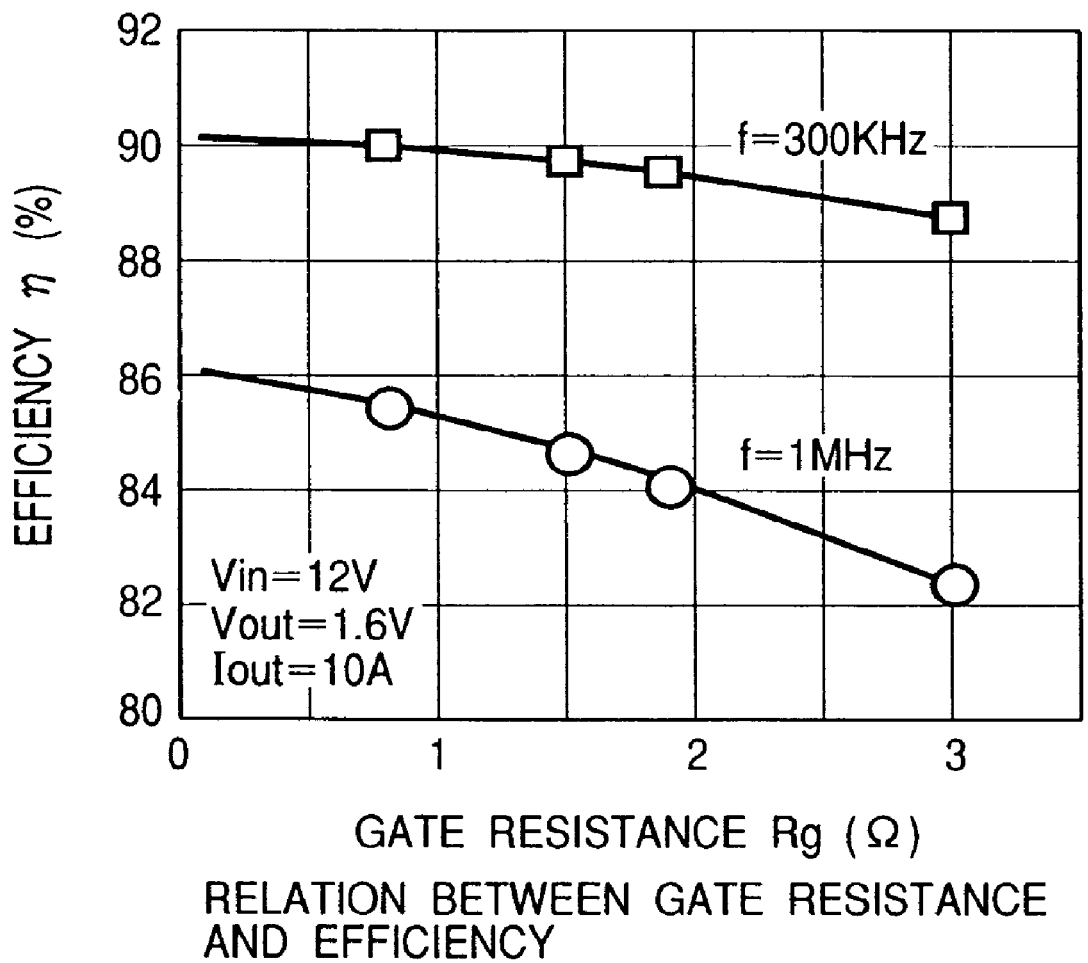
FIG. 17 is a graph showing the relation between the gate resistance and the efficiency for illustrating the effect of Embodiment 1 of the invention.

FIG. 17 is a graph showing the relation between the gate resistance Rg ($\Omega$) and the efficiency $\eta$ (%). As shown in the figure, the efficiency at a frequency of 1 MHz becomes lower than that at 300 kHz. In either case, the efficiency increases with a decreasing gate resistance. However, it will be seen that with the case where the frequency f is at 1 MHz, the gradient in the graph is sharper than that at 300 kHz, and an increasing rate of the efficiency based on the lowering of the gate resistance is great. It will be noted that the input potential Vin is at 12V, the out potential Vout is at 1.6 V and the output current Iout is at 10 A.

Accordingly, in power MISFET corresponding to a high frequency potential, it is convenient to use such a structure as stated in this embodiment.

It will be noted that extensive studies on the structure have been made wherein a gate finger portion G2 and the like are disposed, revealing that the gate resistance can be suppressed to 1$\Omega$ or below.

Figure 38:
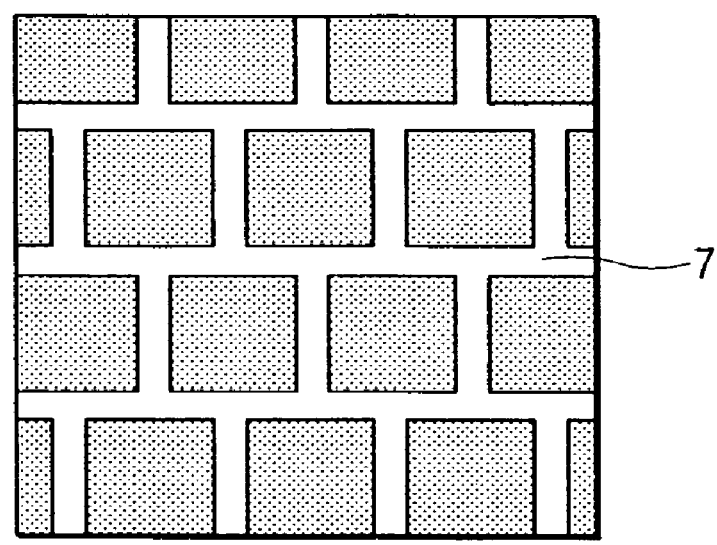
FIG. 38 is a plan view showing an essential part of a substrate showing a still further groove pattern according to an embodiment of the invention.

Upon comparison with an existing structure checked by the inventors (i.e. a structure having such a pattern of a groove 7 as shown in FIG. 38 and not formed with the gate finger portion G2), the device having the structure according to this embodiment exhibits an improved efficiency of about 2% at 300 kHz and from 2 to 4% at 1 MHz.

In this manner, the gate resistance Rg can be reduced and thus, the efficiency can be improved.

It will be noted that the shape in pattern of the contact groove may be anyone which allows the connection between the gate electrode GE and the gate portion G, and also between the source electrode SE and the n'-type semiconductive region 17 and should not be construed as limiting to the shape which has been illustrated with reference to FIG. 9. However, in order to reduce the gate resistance Rg and the like, it is as a matter of course that the contact area of these portions should preferably be greater.

Although the polysilicon film is used as a gate portion in this embodiment, other types of films including a silicide film and a composite film of polysilicon and silicide may be likewise used.

Embodiment 2

Although the space S1 is provided between the contact groove 21a and 21b (see FIG. 9) and any gate finger portion G2 is not formed on the space S1 (see FIGS. 11, 12) in Embodiment 1, the contact grooves 21a and 21b may be connected to each other and the gate finger portion G2 and the gate electrode G1 may be connected together over the space S1.

Figure 18:
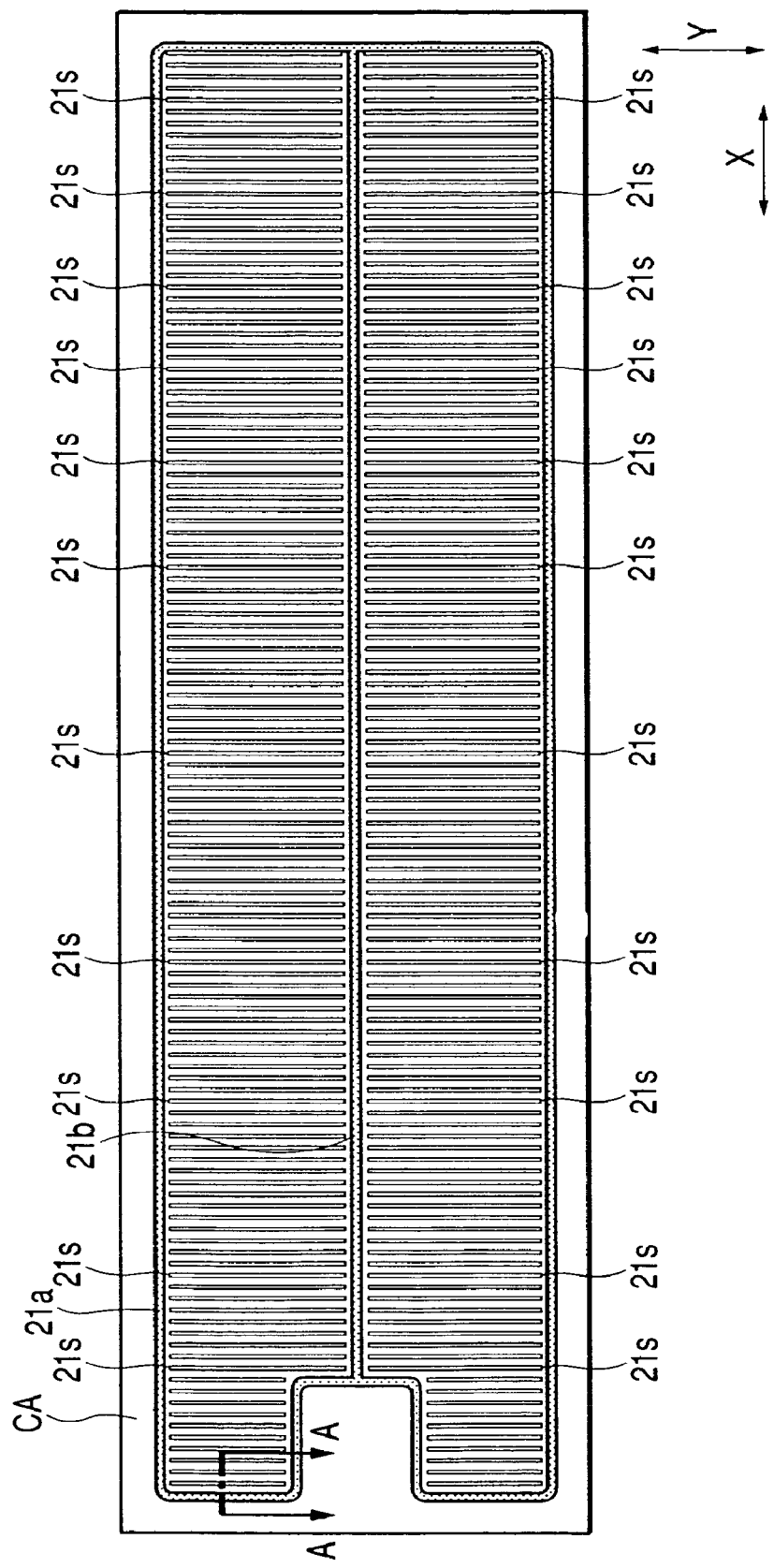
FIG. 18 is a plan view of an essential part of a substrate showing a fabrication method of a semiconductor device according to Embodiment 2 of the invention.
Figure 19:
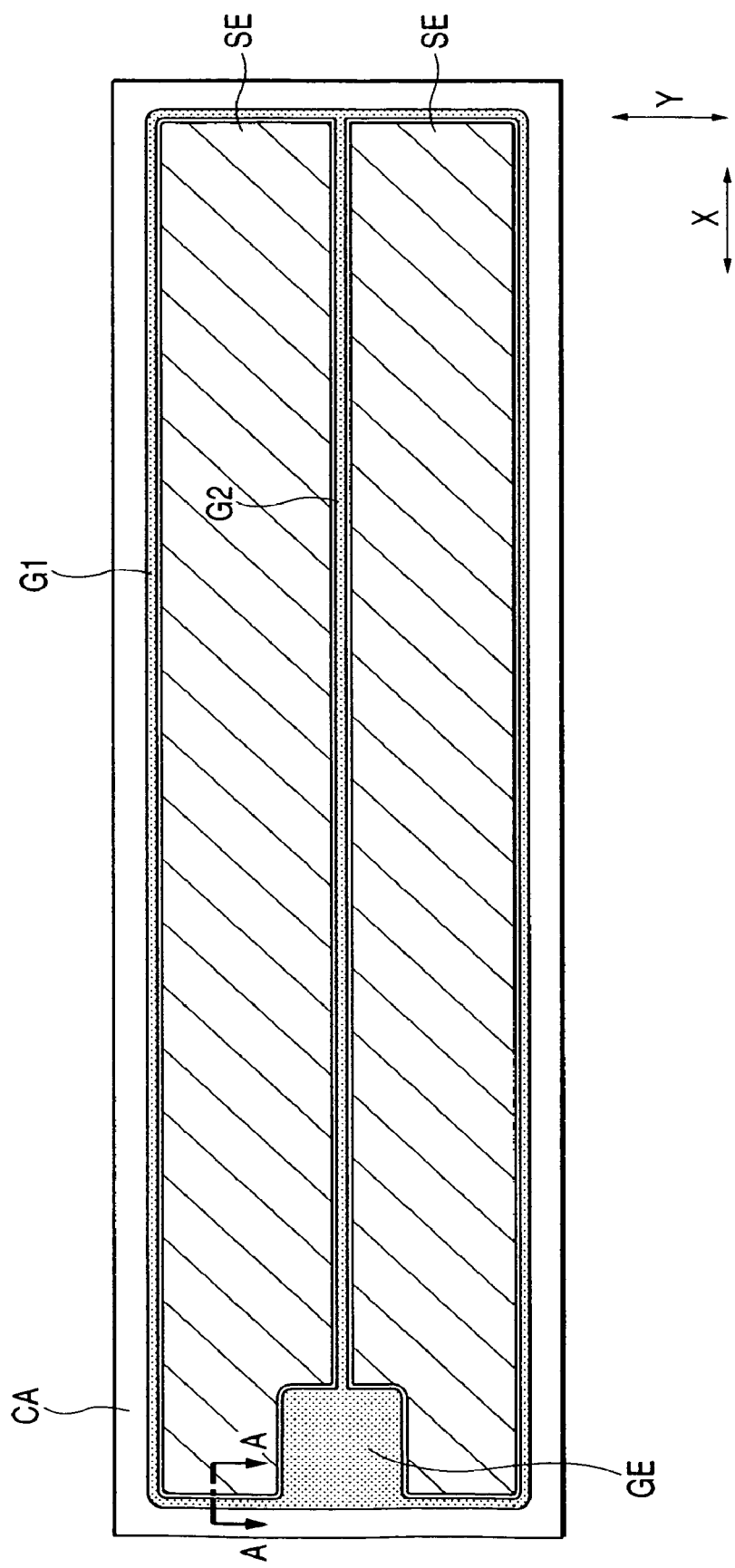
FIG. 19 is a plan view of the essential part of the substrate showing the fabrication method of a semiconductor device according to Embodiment 2 of the invention.

FIG. 18 shows a pattern of contact grooves (21a, 21b, 21s). FIG. 19 shows a pattern of a gate electrode GE and a source electrode SE. As shown in FIG. 19, the source electrode SE is divided into halves.

It will be noted that because those other than the patterns of the contact grooves and the gate electrode GE and the source electrode SE are similar to in Embodiment 1, the structures of the respective members and procedures for forming same are not described herein.

Embodiment 3

The case where only one gate finger portion G2 is formed along the direction of X (see FIGS. 11, 12) has been illustrated in Embodiment 1. Alternatively, an increasing number of gate fingers may be provided as described below.

Figure 20:
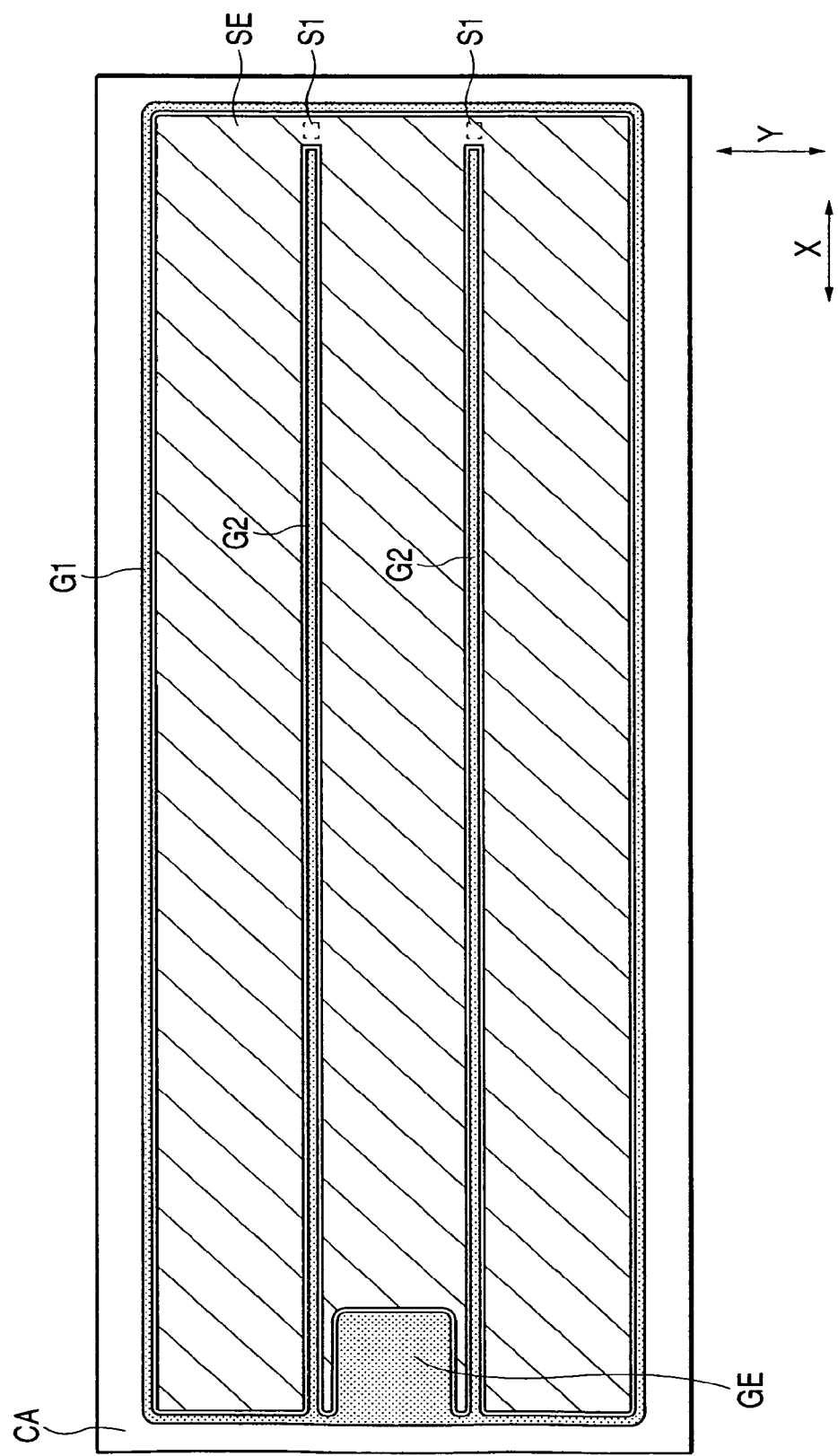
FIG. 20 is a plan view of an essential part of a substrate showing a fabrication method of a semiconductor device according to Embodiment 3 of the invention.

FIG. 20 shows a pattern of a gate electrode GE and a source electrode SE wherein two gate finger portions G2 are provided.

Figure 21:
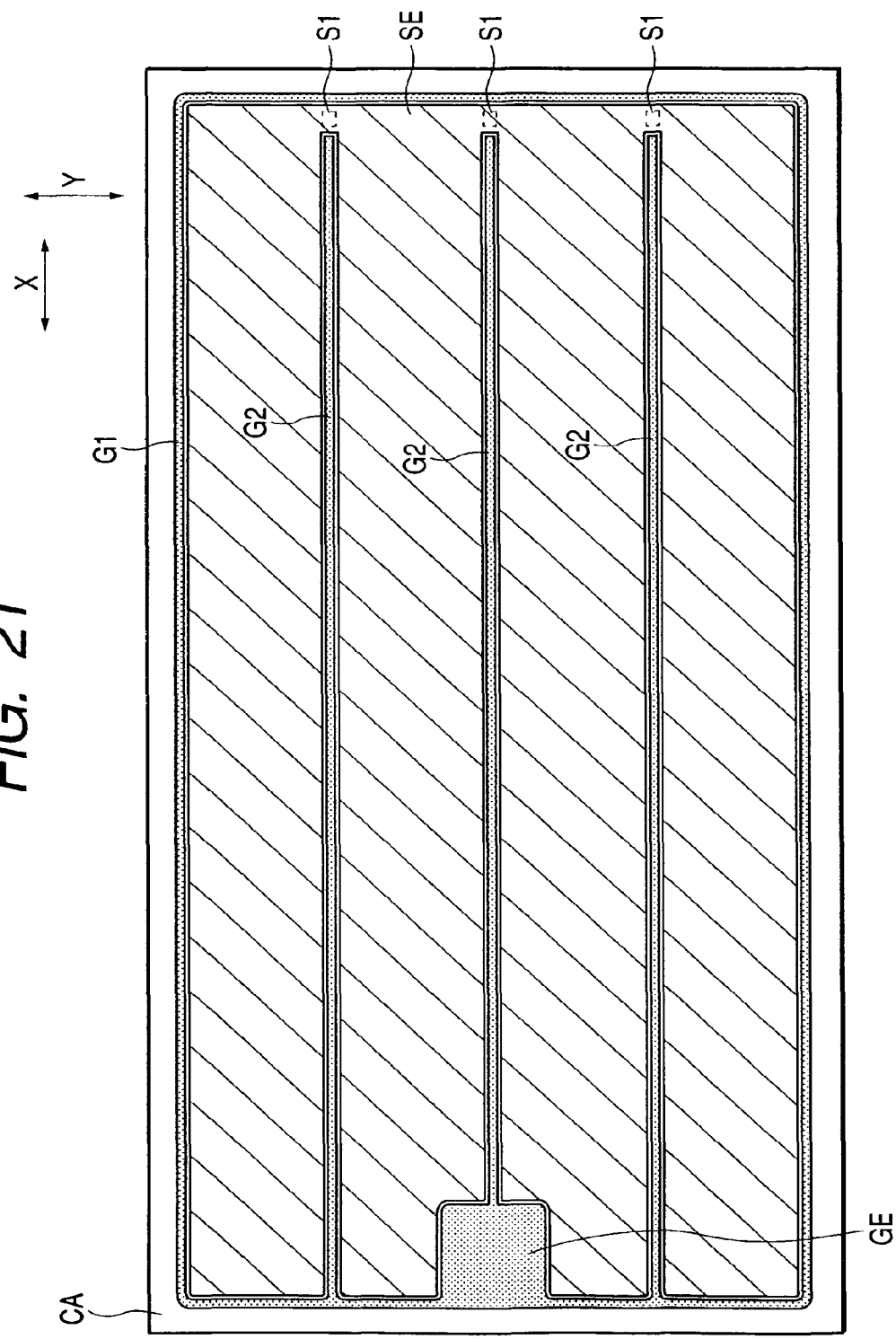
FIG. 21 is a plan view of the essential part of the substrate showing the fabrication method of a semiconductor device according to Embodiment 3 of the invention.

FIG. 21 is a pattern of a gate electrode GE and a source electrode SE wherein three gate finger portions G2 are provided.

It will be noted that contact grooves (21a, 21b) may be formed in the same pattern as the gate electrode GE.

In this way, an increase in number of the gate finger portions allows the gate resistance Rg to be efficiently reduced. Especially, it is preferred that where the gate portion G is elongated along the direction of Y correspondingly to the size of the chip region, the number of gate fingers is increased to reduce the gate resistance.

In FIGS. 20 and 21, any gate finger G2 is not provided over the space S1. Alternatively, as illustrated with respect to Embodiment 2, the gate finger portion G2 may be connected to the gate electrode portion G1 over the space S1.

Embodiment 4

In this embodiment, the procedure of forming bump electrodes on the openings 31g, 31s illustrated in Embodiment 1 and mounting a chip is described.

FIGS. 22 to 28 are, respectively, a sectional or plan view of an essential part such as of a substrate showing a method of fabricating a semiconductor device according to this embodiment.

Figure 22:
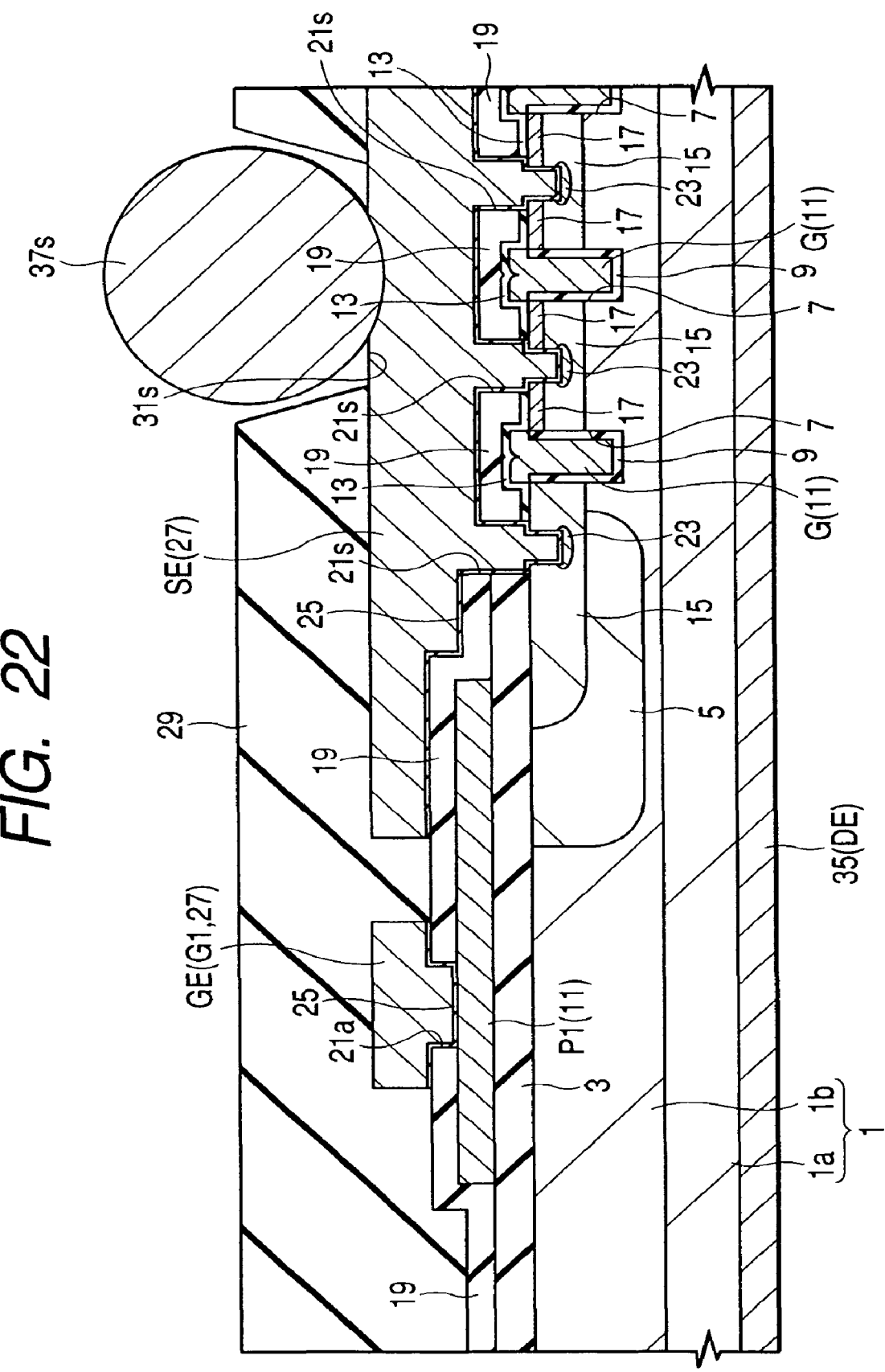
FIG. 22 is a plan view of an essential part of a substrate showing a fabrication method of a semiconductor device according to Embodiment 4 of the invention.
Figure 23:
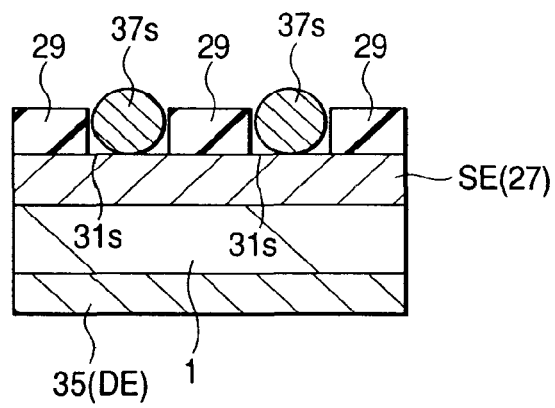
FIG. 23 is a sectional view of the essential part of the substrate showing the fabrication method of a semiconductor device according to Embodiment 4 of the invention.
Figure 24:
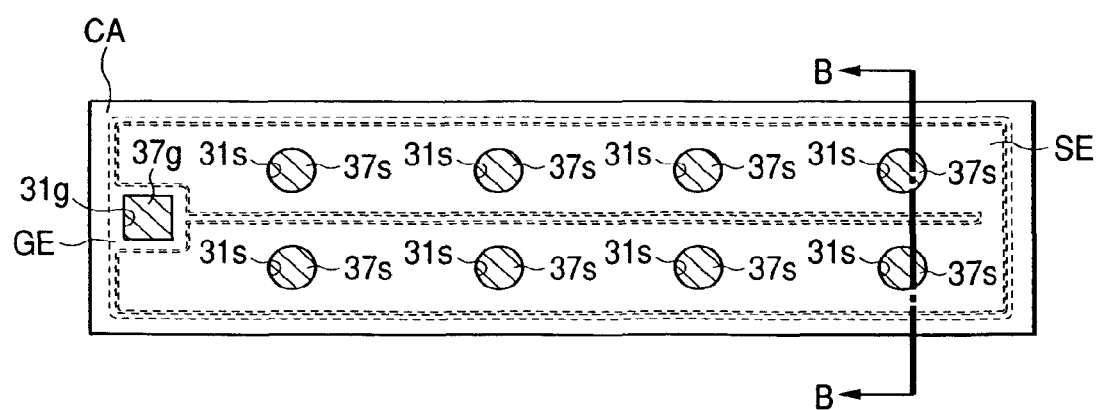
FIG. 24 is a plan view of the essential part of the substrate showing the fabrication method of a semiconductor device according to Embodiment 4 of the invention.

Initially, a substrate 1 of the type, which has been described in Embodiment 1 with reference to FIGS. 14 and 15, is provided. As shown in FIGS. 22 to 24, bump electrodes 37g, 37s made of a metal such as gold or the like are formed on the openings 31g, 31s, respectively. FIG. 23 is a sectional view schematically showing the state of the substrate in the vicinity of the opening 31s, and FIG. 24 is a plan view of an essential part of the substrate. FIG. 23 corresponds to the section taken along line B-B of FIG. 24.

Reference numeral 37g indicates a bump electrode for connection with a gate electrode DE, and reference numeral 37s indicates a bump electrode for connection with a source electrode SE. These bump electrodes 37s, 37g can be formed, for example, by placing balls of molten gold over the openings 31g, 31s, respectively.

Next, the wafer-shaped substrate 1 is diced, for example, in a rectangular form along the chip region.

Figure 25:
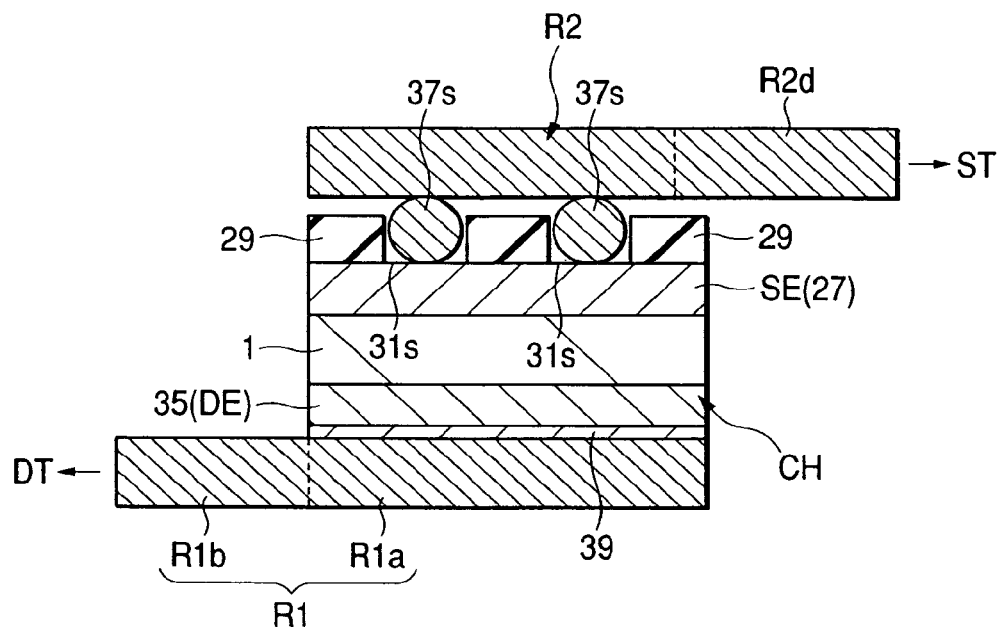
FIG. 25 is a sectional view of the essential part of the substrate showing the fabrication method of a semiconductor device according to Embodiment 4 of the invention.
Figure 26:
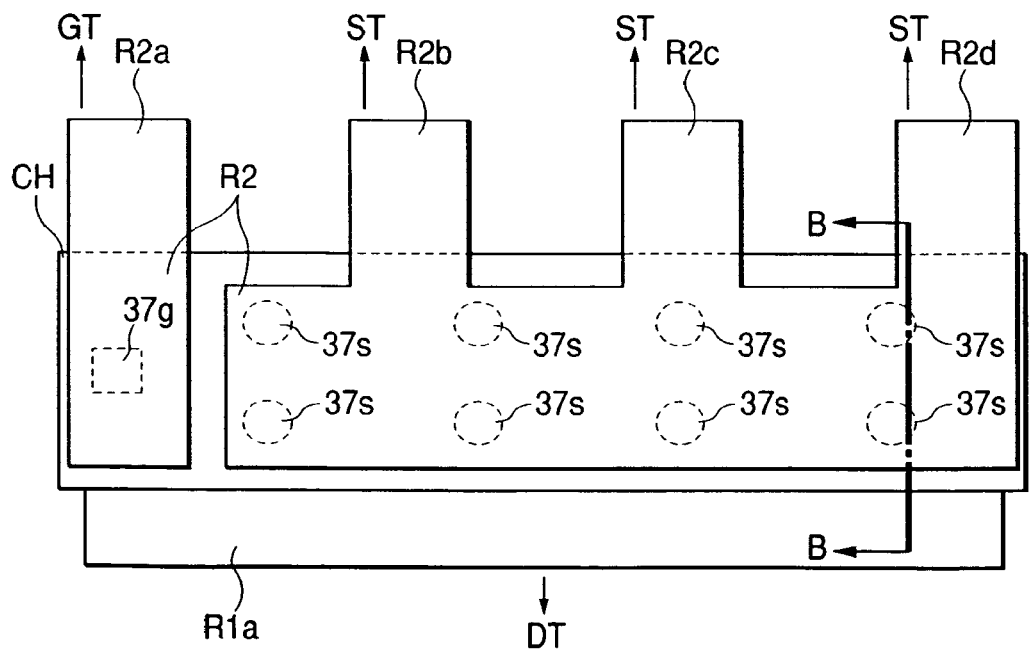
FIG. 26 is a plan view of the essential part of the substrate showing the fabrication method of a semiconductor device according to Embodiment 4 of the invention.

Thereafter, as shown in FIGS. 25 and 26, a chip CH is bonded to and fixed on a lead frame R1 at the back side thereof by use of a silver (Ag) paste 39 or the like. The lead frame R1 has a chip mounting portion R1a and an external terminal R1b. In doing so, the lead frame R1 and the back side (drain electrode DE) of the chip CH are electrically connected to each other. More particularly, the external terminal R1b becomes a drain terminal DT.

On the other hand, the chip CH has a lead frame R2 mounted on the surface side thereof, followed by thermocompression to permit the bump electrodes 37s, 37g and the lead frame R2 to be bonded together. The lead frame R2 has four external terminals R2a to R2d, of which the external terminals R2b to R2d are electrically connected to the bump 37s, respectively, and the external terminal R2a is electrically connected to the bump electrode 37g. More particularly, the external terminal Ra serves as a gate terminal GT and the external terminals R2b to R2d serve as a source terminal ST.

Figure 27:
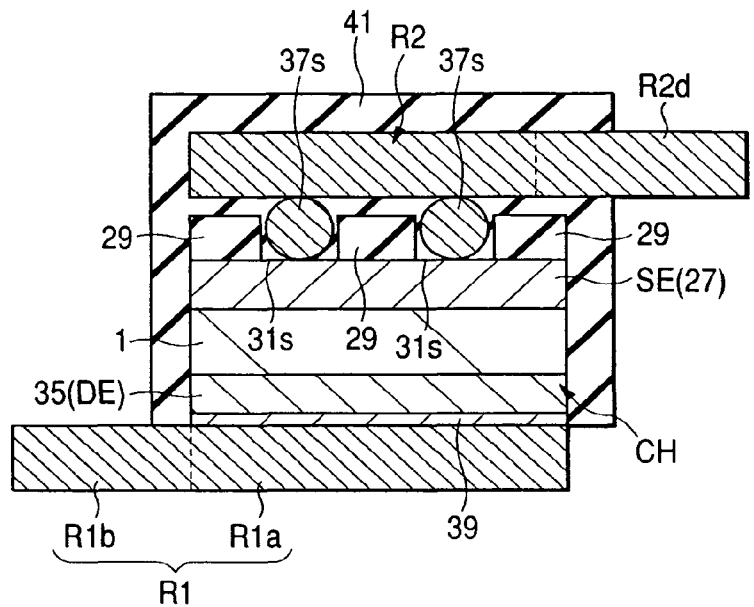
FIG. 27 is a sectional view of the essential part of the substrate showing the fabrication method of a semiconductor device according to Embodiment 4 of the invention.
Figure 28:
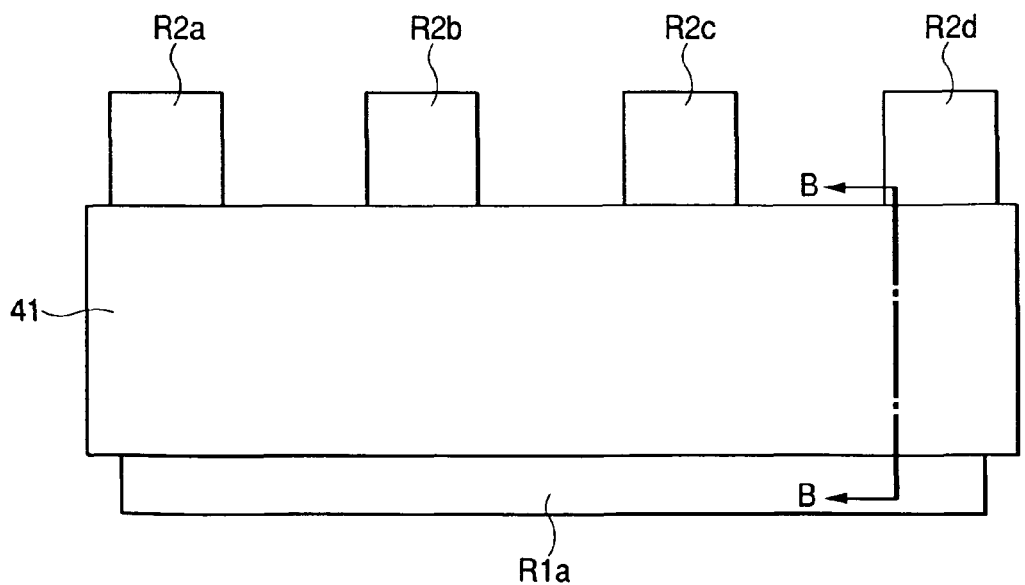
FIG. 28 is a plan view of the essential part of the substrate showing the fabrication method of a semiconductor device according to Embodiment 4 of the invention.

Subsequently, as shown in FIGS. 27 and 28, a resin melt 41 is charged and cured, for sealing, between the chip CH and lead frame R2 and over the lead frame R2.

According to this embodiment, because the connection with the external terminals R2a to R2d is established by use of the bump electrodes, the connection resistance between the source electrode SE or gate electrode GE and each of the external terminals R2a to R2d can be reduced.

For instance, although these connections are possible by use of a wire such as of a gold wire, the resistance of the gold wire and the inductance of a source or a gate undesirably increase.

If this inductance is great, (1) a transient induced voltage occurs. This voltage acts as a negative feedback relative to gate drive voltage and increases an ON resistance in the course of the period of transition. Moreover, 2) an impedance between source and drain increases, adversely influencing the transient characteristics under working conditions at a large electric current and at a high value of di/dt. Such problems as mentioned above are more frequently experienced as the frequency becomes higher.

In contrast, according to this embodiment, the inductance can be reduced, with an improved efficiency and improved device characteristics. It will be noted that as a result of the inventors' study, the device of this embodiment has an efficiency higher by about 1 to 2% than a package using a gold wire.

Especially, as described in detail in Embodiment 1, if the resistance Rg of the gate portion is reduced by trying various measures for the arrangement of the gate electrode and the source electrode, the reduction effect of the gate resistance Rg cannot be satisfactorily shown under high frequency working conditions in case where the resistance or inductance becomes large in association with external terminals.

Accordingly, the package form (or package structure) set forth in this embodiment may be one which is suitable for use in power MISFET set out in Embodiment 1 and the like. Of course, this package structure may be applicable to structures different from the power MISFET described in Embodiment 1.

Embodiment 5

In Embodiment 4, although the bump electrodes have been formed on the gate electrode GE and the like, a bump electrode may be formed after formation of a conductive film made, for example, of Al on the gate electrode GE as described below.

Figure 29:
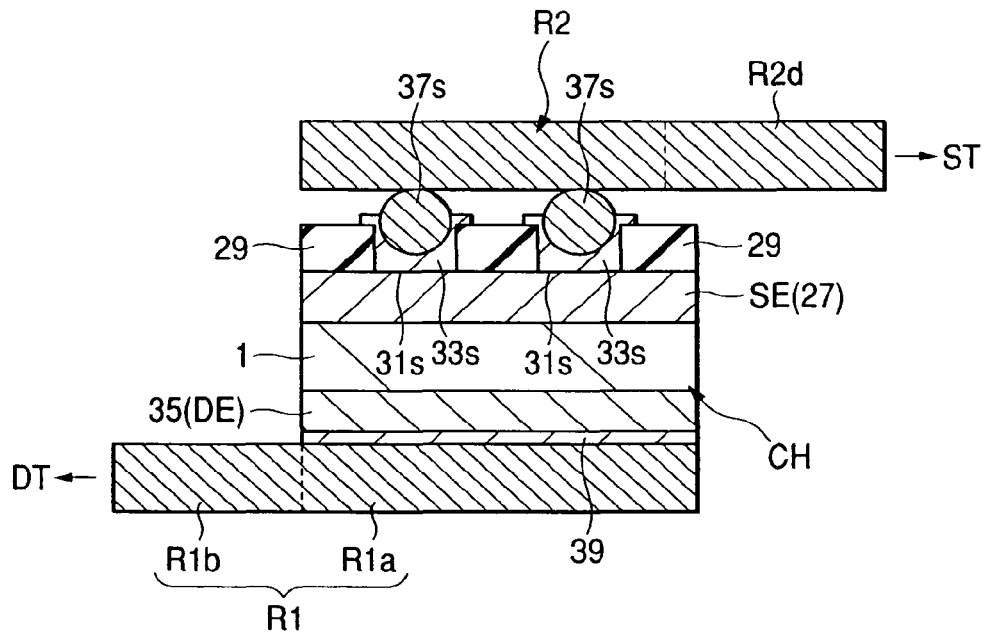
FIG. 29 is a sectional view of the essential part of the substrate showing the fabrication method of a semiconductor device according to Embodiment 4 of the invention.
Figure 30:
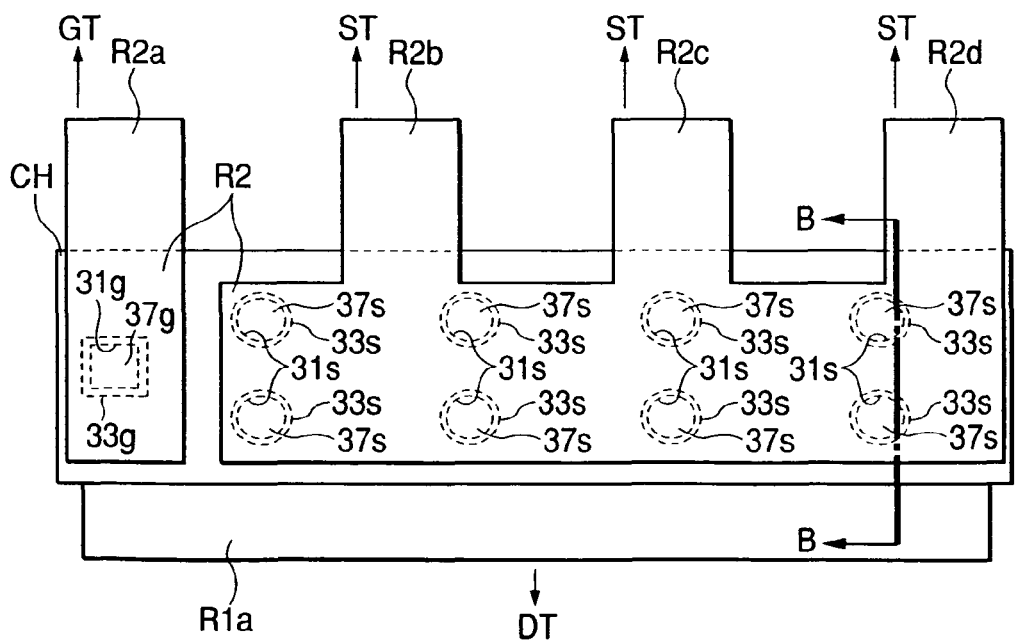
FIG. 30 is a plan view of the essential part of the substrate showing the fabrication method of a semiconductor device according to Embodiment 4 of the invention.

FIGS. 29 and 30 is, respectively, a sectional view of an essential part of a substrate and the like showing a semiconductor device according to this embodiment.

First, a substrate 1 of the type, which has been illustrated with reference to FIGS. 14 and 15 in Embodiment 1, is provided. As shown in FIGS. 29 and 30, a conductive film such as, for example, an Al film (33) is deposited over a polyimide resin film 29 including the insides of the openings 31g, 31s.

Next, the Al film (33) is so patterned as to be larger in size than the openings 31g, 31s. Reference numeral 33g indicates an Al film over the opening 31g and reference numeral 33s indicates an Al film over the opening 31s.

Thereafter, bump electrodes 37g, 37s are, respectively, formed on the Al films 33g, 33s in the same manner as in Embodiment 4.

The wafer-shaped substrate 1 is diced and individual chips are packaged. These steps may be performed in the same manner as in Embodiment 4 and are not described again.

As will be apparent from the above, the Al films 33g, 33s are, respectively, formed below the bump electrodes 37g, 37s in addition to the Al film 27 constituting the gate electrode and the source electrode in accordance with this embodiment, so that stress exerted upon the formation of the bump electrodes 37g, 37s or upon the connection of the lead frames R1, R2 can be mitigated, thereby reducing a bonding damage.

With packaging using a so-called wire bonding technique, stress is exerted on chips only when wire bonding is performed. Accordingly, the need for applying the embodiment of the invention to the technique is not great. Nevertheless, the technique set out in this embodiment is important for the package using bump electrodes because stress is applied to not only at the time of formation of bump electrodes, but also at the time of connection (thermocompression) between the lead frame and the bump electrode, under which bonding damage is liable to occur.

This stress may be mitigated by forming a thick Al film (27) constituting the gate electrode and the source electrode. However, if the Al film is formed as being thick, a subsequent processing step (i.e. for the formation of gate and source electrodes) becomes difficult.

Especially, as illustrated in Embodiment 1 or the like, where the gate finger portion G2 is provided at the gate electrode GE, the pattern becomes complicated in shape, so that the procedure of this embodiment wherein the Al films are built up is appropriate.

The Al films 33g, 33s are formed only over the openings 33g, 33s, under which film stress exerted on the substrate can be mitigated. More particularly, when the forming areas of the Al films 33g, 33s are increased, film stress becomes great, causing the substrate to be strained or cracked.

In the power MISFET illustrated in Embodiment 1 or the like, a bump electrode is formed over the gate portion G and the gate portion G has a trench structure. In this case, stress is liable to be exerted on the upper end portion of the groove 7 shown in FIG. 22, thereby causing gate breakage. In the case, it is favorable to use conductive films (i.e. the Al films 33g, 33s) of this embodiment for stress relaxation. It will be noted that the technique of this embodiment is applicable to those structures different from power MISFET set forth in Embodiment 1.

Embodiment 6

Many tests (inspections) are usually conducted in the course of fabrication of semiconductor devices or after completion of the devices.

For instance, whether or not power MISFET works properly is inspected by applying a given potential to the gate electrode GE or source electrode SE that has been illustrated with reference to FIG. 11 in Embodiment 1. This inspection is called a probe inspection, which is carried out by applying a potential via a probe to electrodes of individual chip regions of a wafer-shaped substrate.

This probe inspection may be carried out, for example, by bringing a probe into contact with the gate electrode GE and the source electrode SE exposed from the openings 31g, 31s shown in FIG. 15. In this case, however, a probe trace (a scar with the probe) is left on the surface of the gate electrode and the like.

If bump electrodes (37g, 37s) are formed on the probe traces, connection failure or the lowering of connection strength may be caused.

Figure 31:
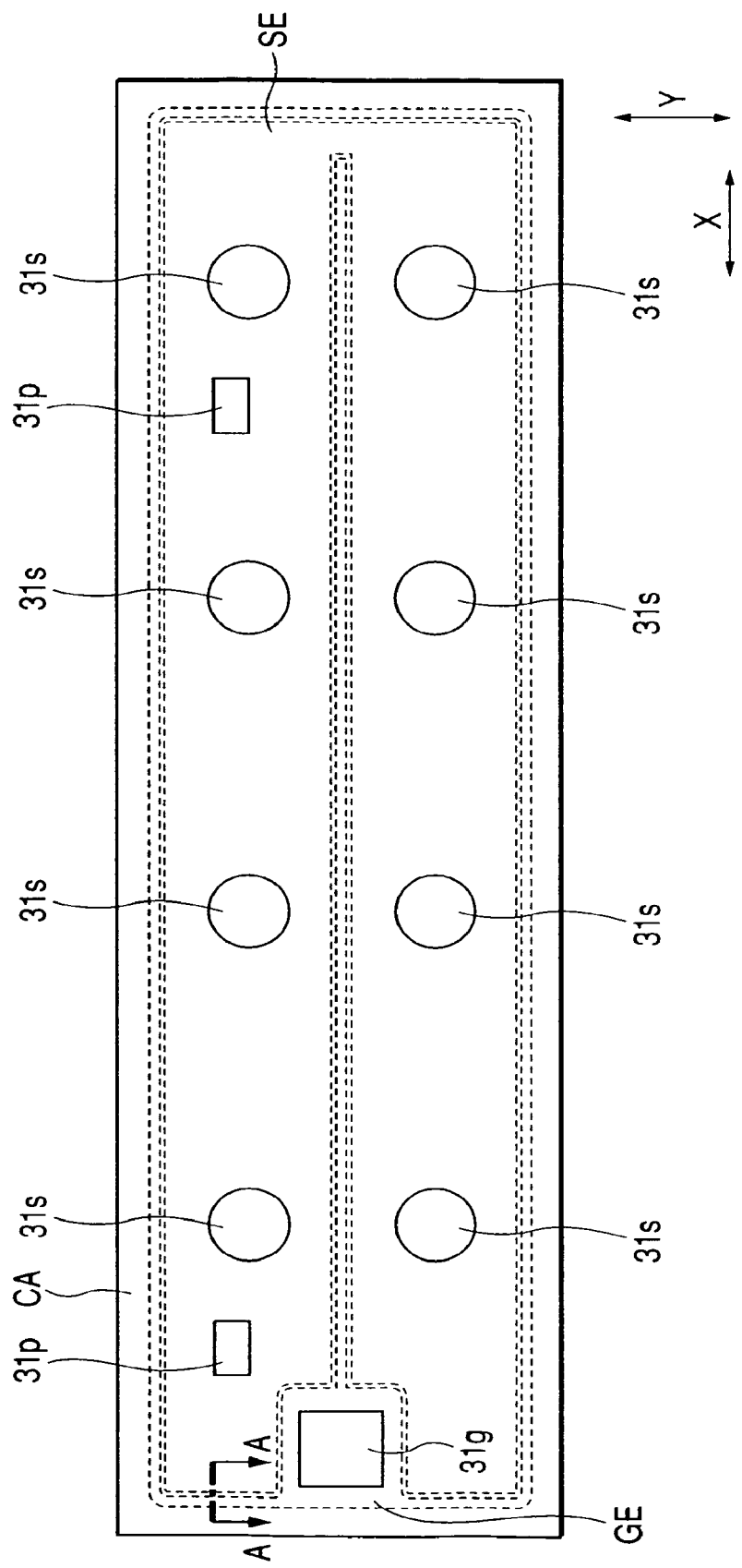
FIG. 31 is a plan view of an essential part of a substrate showing a fabrication method of a semiconductor device according to Embodiment 5 of the invention.
Figure 32:
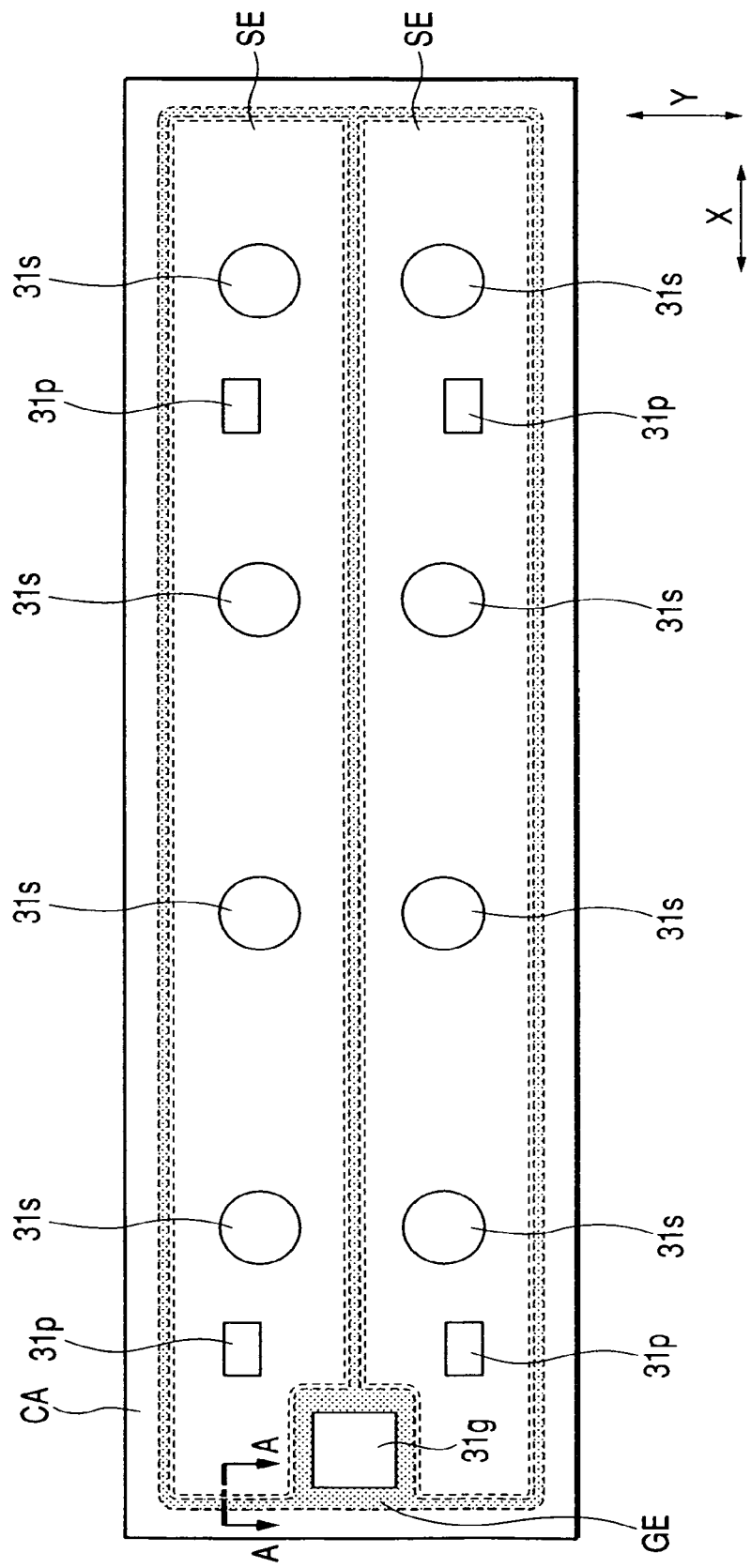
FIG. 32 is a plan view of the essential part of the substrate showing the fabrication method of a semiconductor device according to Embodiment 5 of the invention.

To avoid this, according to this embodiment, an opening 31p for probe inspection (or for measurement) is provided aside from the openings for bump electrodes (FIG. 31). A plurality of openings 31p may be provided depending, on the number of inspections. For example, a sense inspection terminal, a focus inspection terminal and the like may be provided.

In the MISFET of this embodiment, a pad for probe inspection is formed on a so-called active region in order to make effective use of the chip area. The term "on active region" means, for example, a region that is marked out with the silicon oxide film 3 formed beneath the gate electrode GE shown in FIG. 16. The active region is partitioned with this silicon oxide film 3 substantially in a rectangular form. In other words, the active region is surrounded with the silicon oxide film 3.

In contrast, a pad for probe inspection may be provided, for example, at a region other than the active region (e.g. a stripe region extending to around the active region or between the chip regions). However, such a region is very narrow, making it difficult to provide the pad for probe inspection. If a pad for probe inspection is provided in a peripheral region, the chip size becomes great, so that the number of chips obtained form one wafer is reduced. This eventually leads to higher manufacture costs.

FIG. 31 is a plan view of an essential part of the substrate after the formation of openings. An opening 31p is formed over the source electrode SE simultaneously with the formation of the openings 31s, 31g for bump electrode shown in the figure. It will be noted that all the steps before the step of forming the polyimide film 29, inclusive, are carried out in the same manner as in Embodiment 1 and are not described again. After the formation of the opening 31p, such an opening is used for probe inspection, after which bump electrodes are formed in the same manner as in Embodiment 4, followed by dicing and packaging. Of course, an opening for probe inspection may be formed over the gate electrode.

The pattern of the opening 31p is in a rectangular (or oblong) form. The rectangle-shaped pattern permits easy contact of a probe and a reduced opening area. It should be noted that any bump electrode 31p is not formed over the opening 31p, which is covered, for example, with a resin 91.

Figure 36:
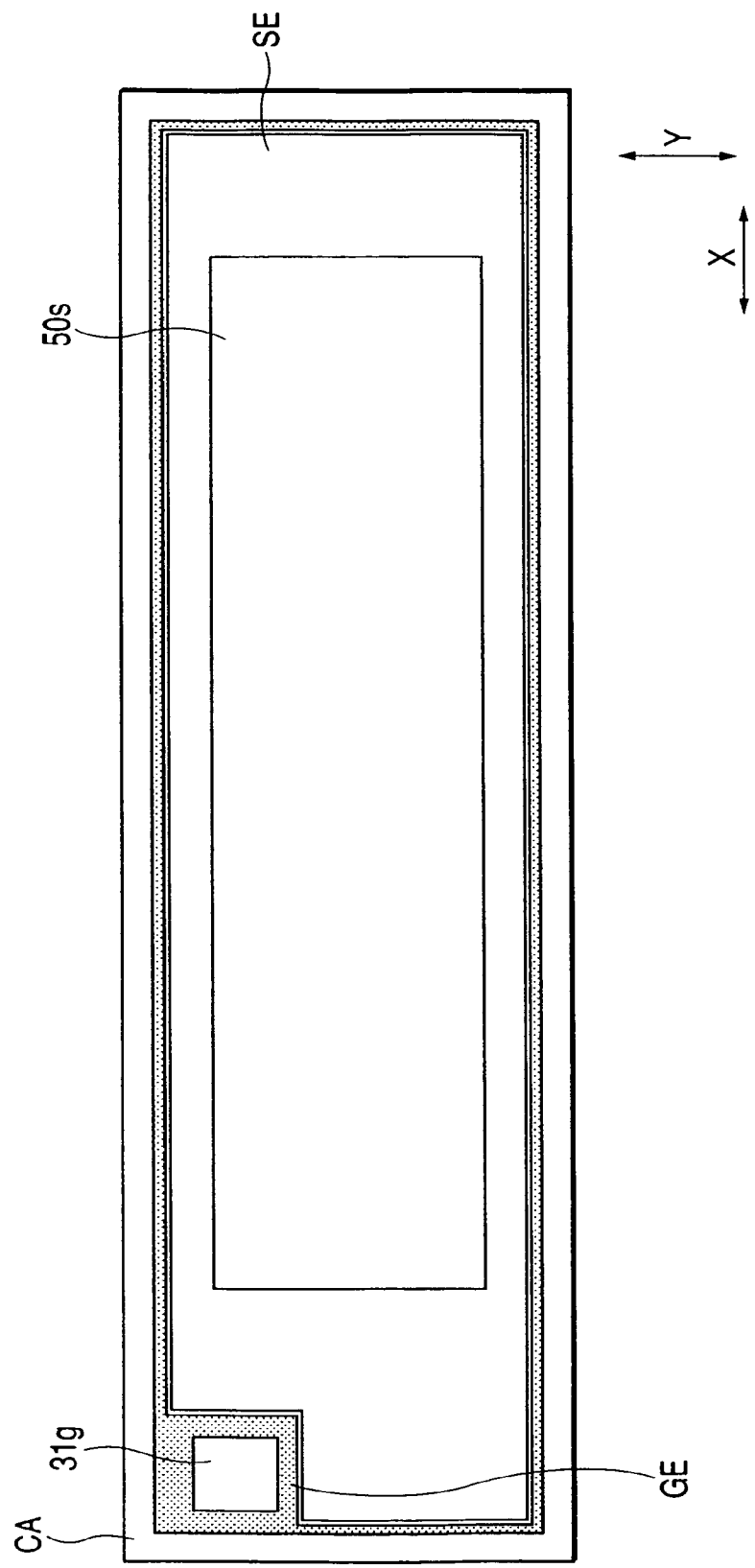
FIG. 36 is a sectional view of the essential part of the substrate for illustrating the effect of Embodiment 5 of the invention.

As shown in FIG. 36, for example, in case where any gate finger portion G2 is not formed, a large-sized opening 50s can be formed within a chip region CA. In this case, it is unlikely that a bonding portion is formed on a probe trace.

Accordingly, as illustrated in the above embodiment, where the gate finger portion G2 is provided or where connection with an external terminal through a bump electrode is intended, it is preferred to form an opening 31p for probe inspection.

As having illustrated in Embodiment 2, where the gate finger portion G2 and the gate electrode portion G1 formed along the periphery of the chip region CA are connected with each other over the space S1, it is favorable to form an opening 31p for probe inspection on individual halves obtained by division of the source electrode SE.

In this way, when the opening 31p for probe inspection is formed on each of the divided source electrode SE, element characteristics of the respective region can be accurately obtained.

On the contrary, where the patterns of the source electrode SE are integrally connected with each other, it is convenient to form an opening 31p for probe inspection in any of the regions and the probe inspection time (number of inspections) can be reduced.

Figure 33:
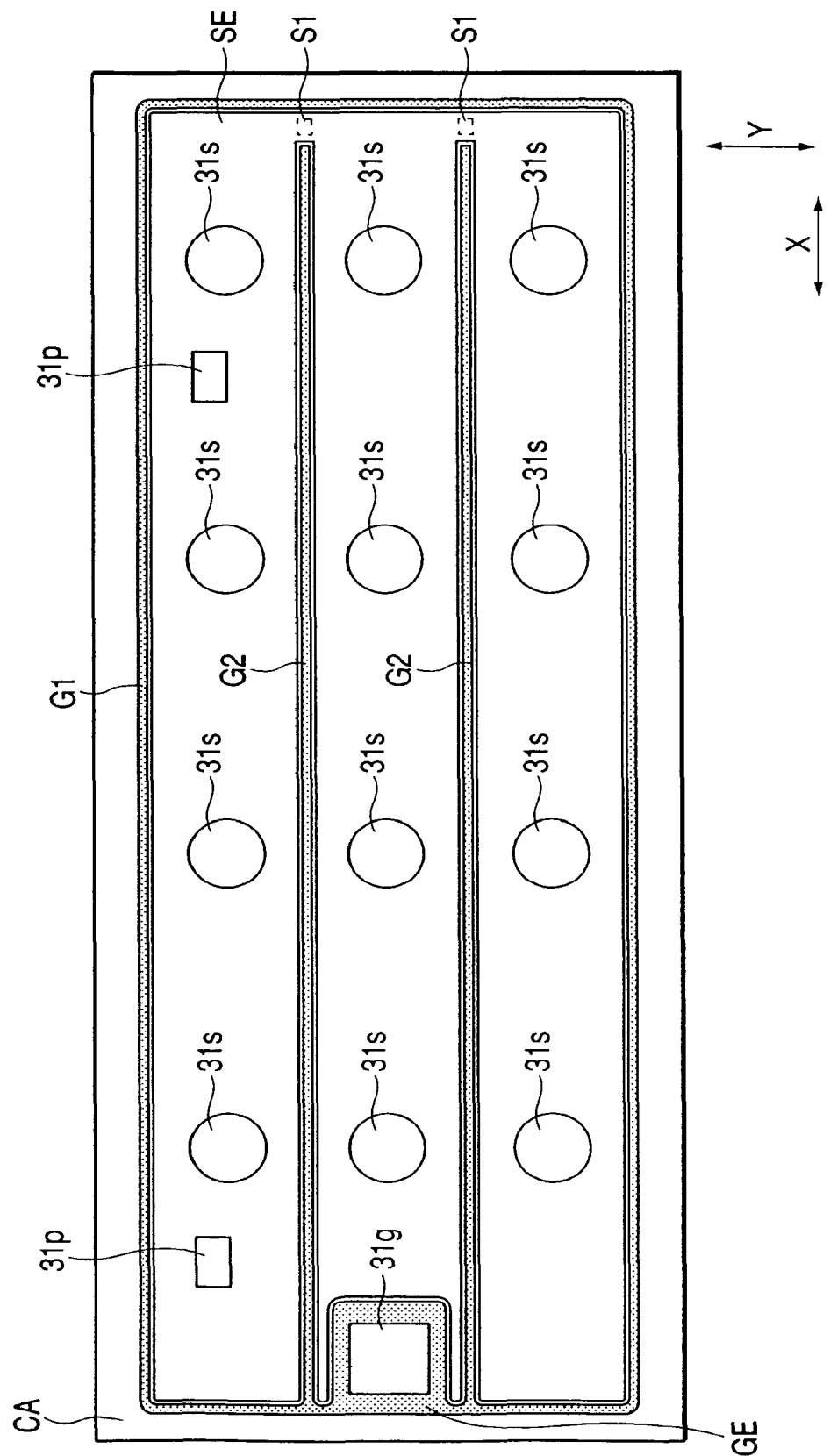
FIG. 33 is a plan view of the essential part of the substrate showing the fabrication method of a semiconductor device according to Embodiment 5 of the invention.
Figure 34:
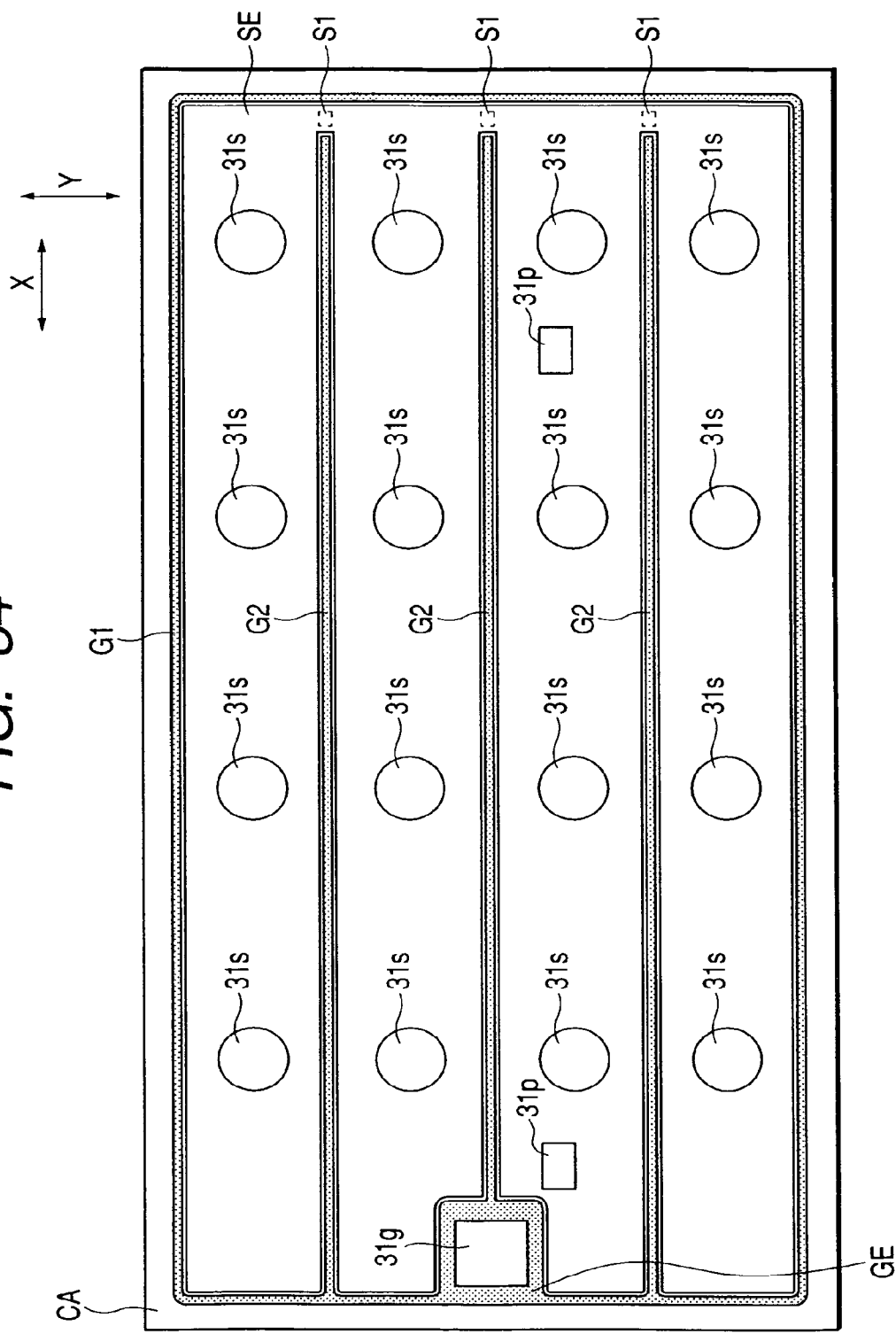
FIG. 34 is a plan view of the essential part of the substrate showing the fabrication method of a semiconductor device according to Embodiment 5 of the invention.

In this embodiment, although the case where the electrode is divided into halves (FIG. 31) has been illustrated, this embodiment is applicable to the case where the electrode is divided into plural pieces as illustrated in Embodiment 3. FIG. 33 shows an instance of a layout of openings 31p for probe inspection in case where two gate fingers G2 are provided. Likewise, FIG. 34 shows an instance of a layout of openings 31p for probe inspection in case where three gate fingers G2 are provided.

According to this embodiment, unlike the case shown in FIG. 36, the source electrode SE and the like are widely covered with a polyimide resin, so that a satisfactory contact area with a sealing resin is ensured, thereby preventing moisture or the like from entering into the openings.

It will be noted that this embodiment is applicable to a structure other than that of power MISFET set forth in Embodiment 1.

Although the invention made by us has been particularly described based on the embodiments, the invention should not be construed as limiting top these embodiments and many changes are possible without departing from the spirit of the invention.

Especially, in the foregoing embodiments, the case where the groove 7 is in a striped pattern has been set out. Besides, the groove may be formed in such patterns as shown in FIGS. 37 and 38, respectively. FIG. 37 shows a case where the external shape of the groove 7 is in octagon-shaped mesh, and FIG. 38 shows a case where the external shape of the groove 7 is in square-shaped mesh.

The effects of typical embodiments disclosed in the present invention are briefly described below.

Agate finger (second portion) is provided at a gate electrode of power MISFET, so that the gate resistance can be reduced, thus leading to improved characteristics of semiconductor device.

The gate electrode and source electrode of power MISFET are connected to external terminals by use of bump electrodes, so that the characteristics of semiconductor device can be improved.

What is claimed is:

1. A semiconductor device comprising:
    a MISFET disposed in a chip region of a semiconductor substrate and having a gate comprised of a first conductor, a source, and a drain;
    a gate electrode disposed over the gate and electrically coupled to the gate, the gate electrode being comprised of a second conductor having a resistivity lower than the first conductor, and the gate electrode having a gate finger portion;
    a source electrode disposed over the source and electrically coupled to the source, the source electrode being comprised of the second conductor, and the source electrode having a plurality of regions;
    a drain electrode disposed over the drain and electrically coupled to the drain of the MISFET;
    a gate bump electrode disposed over the gate electrode and electrically coupled to the gate of the MISFET;
    a plurality of source bump electrodes disposed over each of the respective plurality of regions of the source electrode;
    a gate lead disposed over the gate bump electrode and electrically coupled to the gate bump electrode;
    a source lead disposed over the source bump electrodes and electrically coupled to the plurality of source bump electrodes;
    a drain lead disposed over the drain electrode and electrically coupled to the drain electrode; and
    a resin body sealing the semiconductor substrate,
    wherein the gate electrode and the source electrode are formed in a same conductive layer, and
    wherein the gate finger portion of the gate electrode is located between two adjacent regions of the plurality of regions of the source electrode.

2. A semiconductor device according to claim 1,
    wherein the gate electrode has a periphery portion coupled to the gate finger portion,
    wherein the periphery portion of the gate electrode is disposed along a periphery of the chip region, and
    wherein the gate finger portion of the gate electrode is disposed in an area which is surrounded by the periphery portion of the gate electrode.

3. A semiconductor device according to claim 1,
    wherein the gate bump electrode is substantially aligned with the gate finger portion of the gate electrode as viewed in a lengthwise direction of the gate finger portion of the gate electrode.

4. A semiconductor device according to claim 1,
    wherein the gate and the source are respectively disposed on a first surface of the semiconductor substrate, and
    wherein the drain is disposed on a second surface opposite to the first surface.

5. A semiconductor device according to claim 1,
    wherein the first conductor is made mainly of silicon, and
    wherein the second conductor is made mainly of aluminum.

6. A semiconductor device according to claim 1,
    wherein the gate is comprised of the first conductor disposed in a groove disposed in the semiconductor substrate.

7. A semiconductor device according to claim 1,
    wherein the gate includes a plurality of regions disposed in a striped arrangement in the chip region.

8. A semiconductor device according to claim 1,
    wherein the chip region is substantially rectangular in form, and
    wherein the gate finger portion of the gate electrode extends along a long side of the chip region.

9. A semiconductor device according to claim 1,
    wherein the gate includes a plurality of regions disposed within the chip region, and
    wherein the gate finger portion of the gate electrode extends in a direction intersecting a lengthwise direction of each the region of the gate.

10. A semiconductor device according to claim 1, further comprising:
    a protective film having first and second openings over the gate electrode and the source electrode, respectively,
    wherein the gate bump electrode and the plurality of source bump electrodes are respectively disposed at the first and second openings over the gate electrode and the source electrode and are electrically coupled to the gate electrode and the source electrode.

11. A semiconductor device according to claim 10,
    wherein a third opening which exposes the source electrode is disposed in the protective film, and
    wherein the third opening is used for an inspection process.

12. A semiconductor device according to claim 10,
    wherein the resin body covers parts of the gate lead, source lead, and drain lead,
    wherein a portion of the gate lead which is exposed from the resin body serves as a gate terminal,
    wherein a portion of the source lead which is exposed from the resin body serves as a source terminal, and
    wherein a portion of the drain lead which is exposed from the resin body serves as a drain terminal.

* * * * *